United States Patent
Arikan

(10) Patent No.: US 10,985,779 B2
(45) Date of Patent: Apr. 20, 2021

(54) METHOD AND SYSTEM FOR DECODING DATA USING COMPRESSED CHANNEL OUTPUT INFORMATION

(71) Applicant: Polaran Haberlesme Teknolojileri Anonim Sirketi, Ankara (TR)

(72) Inventor: Erdal Arikan, Ankara (TR)

(73) Assignee: Polaran Haberlesme Teknolojileri Anonim Sirketi, Cankaya (TR)

(*) Notice: Subject to any disclaimer, the term of this patent is extended or adjusted under 35 U.S.C. 154(b) by 247 days.

(21) Appl. No.: 16/114,001

(22) Filed: Aug. 27, 2018

(65) Prior Publication Data
US 2020/0067528 A1   Feb. 27, 2020

(51) Int. Cl.
| | |
|---|---|
| H03M 13/13 | (2006.01) |
| G06F 11/10 | (2006.01) |
| H03M 13/11 | (2006.01) |
| H04L 1/00 | (2006.01) |
| H03M 13/53 | (2006.01) |

(52) U.S. Cl.
CPC ......... *H03M 13/13* (2013.01); *G06F 11/1004* (2013.01); *H03M 13/1108* (2013.01); *H04L 1/0071* (2013.01)

(58) Field of Classification Search
None
See application file for complete search history.

(56) References Cited

U.S. PATENT DOCUMENTS

| | | | | | |
|---|---|---|---|---|---|
| 4,291,406 | A | * | 9/1981 | Bahl | ...... H04L 1/0054 714/787 |
| 7,747,922 | B2 | * | 6/2010 | Mielczarek | ...... H04L 1/0013 714/748 |

(Continued)

FOREIGN PATENT DOCUMENTS

EP   3098991 A1   11/2016

OTHER PUBLICATIONS

Lee et al., Parallel error-trapping and error-detection decoding, IEEE, Conference Paper, pp. 35-38 (Year: 1991).*

(Continued)

*Primary Examiner* — April Y Blair
*Assistant Examiner* — Dipakkumar B Gandhi

(57) ABSTRACT

A split decoder apparatus in a communication system provides reliable transfer of a transmitted message from a source to a destination. A channel encoder encodes the transmitted message into a transmitted codeword from a channel code and transmits the transmitted codeword over a channel. The channel produces a channel output in response to the transmitted codeword. In the split decoder apparatus, a decode client receives the channel output and generates a compressed error information, and a decode server receives the compressed error information and generates a compressed error estimate. The decode client receives the compressed error estimate and generates a message estimate. Communication complexity between the decode client and the decode server is reduced. The split decoder apparatus optionally generates a no-errors signal from the channel output, where the decode server is not activated if the no-errors signal indicates that the hard decisions correspond to a valid transmitted codeword.

12 Claims, 9 Drawing Sheets

(56) References Cited

U.S. PATENT DOCUMENTS

| | | | | |
|---|---|---|---|---|
| 8,347,186 | B1* | 1/2013 | Arikan | H03M 13/13 714/774 |
| 2003/0126545 | A1* | 7/2003 | Tan | H04L 1/006 714/786 |
| 2005/0022101 | A1* | 1/2005 | Malm | H04L 1/0051 714/801 |
| 2007/0013704 | A1* | 1/2007 | MacWilliams | G06F 13/1684 345/542 |
| 2013/0242899 | A1* | 9/2013 | Lysejko | H04W 76/00 370/329 |
| 2015/0303948 | A1* | 10/2015 | Yoon | H03M 13/45 714/764 |
| 2016/0301429 | A1* | 10/2016 | Shany | H03M 13/1525 |
| 2018/0183464 | A1* | 6/2018 | Ge | H04L 1/0041 |

OTHER PUBLICATIONS

Dr. Gene M. Amdahl, "Validity of the single processor approach to achieving large scale computing capabilities", Spring Joint Computer Conf., 1967, p. 483-485.

Filipe Betzel et al., "Approximate Communication: Techniques for Reducing Communication Bottlenecks in Large-Scale Parallel Systems", ACM Computing Surveys, vol. 51, No. 1, Jan. 2018, 32 pages.

John D'Ambrosia, "100 Gigabit Ethernet and Beyond", IEEE Communications Magazine, Mar. 2010, p. S6-S13.

Hadi Esmaeilzadeh et al., "Dark Silicon and the End of Multicore Scaling", ISCA'11, Jun. 4-8, 2011, p. 365-376.

Ethernet Alliance, "The 2018 Ethernet Roadmap", Mar. 13, 2018, 2 pages.

Yasaman Ghasempour et al., "IEEE 802.11ay: Next-Generation 60 GHz Communication for 100 Gb/s Wi-Fi", IEEE Communications Magazine, Dec. 2017, p. 186-192.

"IEEE Standard for High Data Rate Wireless Multi-Media Networks, Amendment 2: 100 Gb/s Wireless Switched Point-to-Point Physical Layer", IEEE Std 802.15.3d-2017, Sep. 28, 2017, 55 pages.

David Law et al., "Evolution of Ethernet Standards in the IEEE 802.3 Working Group", IEEE Communications Magazine, Aug. 2013, p. 88-96.

Borivoje Nikolic et al., "Design in the Power-Limited Scaling Regime", IEEE Transactions on Electron Devices, vol. 55, No. 1, Jan. 2008, p. 71-83.

Patrick J. Zabinski et al., "Coming Challenges with Terabit-per-Second Data Communication", IEEE Circuits and Systems Magazine, Aug. 20, 2013, p. 10-20.

Notification of Transmittal of the International Search Report and the Written Opinion of the International Searching Authority, or the Declaration dated Dec. 11, 2019 in connection with International Patent Application No. PCT/IB2019/057362, 11 pages.

* cited by examiner

METHOD AND SYSTEM FOR DECODING DATA USING COMPRESSED CHANNEL OUTPUT INFORMATION

TECHNICAL FIELD

The present application relates generally to decoding data in a communication system using compressed channel information, more specifically, to decoding data in a communication system employing linear block codes, such as polar codes.

BACKGROUND

To introduce the problem addressed by the present principles in a simple context, consider a discrete memoryless channel (DMC) that receives at time instant i an input $x_i$ from a binary input alphabet $\chi = \{0,1\}$ and produces an output $y_i$ from a finite output alphabet $\mathcal{Y}$ with probability $W(y_i|x_i)$. The conditional probabilities $\{W(y|x): x \in \chi, y \in \mathcal{Y}\}$ characterize the DMC. Consider channel coding on the DMC W using a block code with M codewords with each codeword having length N. Suppose a message m is selected at random from the set of messages $\{1, 2, \ldots, M\}$ and encoded into the mth codeword $x_m = (x_{m,1}, x_{m,2}, \ldots, x_{m,N}) \in \chi^N$ in the codebook. Suppose the codeword $x_m$ is sent over the channel and a channel output $y = (y_1, y_2, \ldots, y_N) \in \mathcal{Y}^N$ is received. Due to the memoryless nature of the channel, the conditional probability of receiving y given that x is transmitted over the DMC is given by a product-form expression $\Pi_{i=1}^{N} W(y_i|x_i)$.

A decoder in such a communication system takes in the channel output y and generates an estimate $\hat{m}$ of the transmitted message m. A key performance measure for such a system is the frame error rate (FER) defined as the probability that the estimate $\hat{m}$ is not equal to the actually transmitted message m.

In high-speed data communications, the delivery of the channel output y from the channel to the decoder may present a severe bottleneck in terms of the necessary data bus bandwidth, cost of data interfaces, and power consumption. The present principles address this problem by introducing methods to compress the channel output y so as to reduce the communications complexity at the receiver without degrading the FER performance of the system. The present principles target primarily communication systems in which the user data rate in bits-per-second (b/s) from a data source to a data destination is high relative to the clock frequency used in the receiver circuitry.

For a more precise statement of where the present principles may be most useful, let $\lambda$ denote the desired user data rate in bits-per-second (b/s) from the source to the destination, let $R = \log_2(M)/N$ denote the rate of the channel code employed in the system. Then, the coded data rate is $\lambda/R$ (b/s), which is also the number of times the binary-input channel W has to be used to transmit the coded bits. At the receiver, the channel output symbols have to be communicated over a data bus carrying binary logic signals. One can represent each channel output symbol $y \in \mathcal{Y}$ by $q = \lceil \log_2 |\mathcal{Y}| \rceil$ bits where $|\mathcal{Y}|$ denotes the number of elements in $\mathcal{Y}$ and $\lceil a \rceil$ denotes the smallest integer greater than or equal to a for any real number a. Then, the rate of data transmission from the channel output to the decoder input is given by $q\lambda/R$ (b/s). If the interconnect (data bus) between the channel output and the decoder input operates at a clock frequency of $f_c$ Hz, the interconnect width (number of lanes) has to be at least $$w = (q\lambda/R)/f_c \quad (1)$$

The present principles target applications where the width w presents a bottleneck to implementation of receiver circuitry because of cost or feasibility. Currently, there are two factors at work that tend to create such a bottleneck. One is the ever present demand for higher user data rates $\lambda$; the other is the slowdown in silicon technology advancements, limiting the clock frequency $f_c$. These factors have been identified and discussed in detail in [ZABIN] in a general context. The present principles address these problems and provide solutions in the context of channel decoders. A brief review of trends in communications standards and silicon technology is given below in order to provide a perspective and motivation for the present disclosure.

The demand for higher data rates $\lambda$ can be seen by looking at the recent standardization activities. For wired connections, the IEEE 802.3ba Ethernet standard specifies a data rate $\lambda$=100 Gigabit-per-second (Gb/s) over optical media [LAW]. In the wireless domain, the IEEE 802.15.3d standard ratified in 2017 defines a 100 Gb/s system using frequencies in the 252-322 Gigahertz (GHz) range [HDRW]. The current IEEE 802.11ay standardization activity aims to deliver 100 Gb/s wireless speeds in the 60 GHz band [GHASE]. The 2018 Ethernet Roadmap [ETHER] foresees demand for Terabit-per-second (Tb/s) data rates for 2020 and beyond. As these examples show, in the near future there will be demand for error correction coding systems operating at data rates $\lambda$ approaching Tb/s. While the demand for higher data rates continues unabated due to increasing Internet traffic advances in silicon technology have not kept pace with such demand, creating the type of communications bottleneck as addressed by the present principles.

Traditionally, the demand for increased data rates $\lambda$ in communication systems could be met by improvements in the semiconductor and Very Large Scale Integration (VLSI) technologies. Until recently, VLSI technology followed remarkably closely the forecasts known as the Moore's law and Dennard's scaling [NIKOL], which together postulate that VLSI performance per unit power grows exponentially over time as semiconductor technology moves from one technology generation to the next roughly every eighteen months. However, as transistor sizes started approaching fundamental physical limits, these forecasts became invalid and the performance and energy efficiency of VLSI technology started to saturate. Although transistor dimensions still continue to shrink in accordance with the Moore's law, transistor switching speeds (clock frequencies) cannot keep increasing due to power density constraints [ESMAE]. With the plateauing of the clock frequency, parallel computing methods, which employ multiple processors, have become the main means of improving computational performance [BETZE]. On the other hand, when a task is split among multiple processors, an interconnection network has to be present among the processors to support inter-processor communication and synchronization. As Amdahl's law [AMDAH] states, even a small amount of latency in the interconnection network in a multi-processor system can drastically reduce the benefits of parallel computing. As a result of the technology evolution described above, the reduction of communications overhead, both in terms of latency and power consumption, has emerged as a key design goal in high performance computing [BETZE]. The present principles address this challenge in the context of high-performance decoders for channel codes.

For a numerical example that illustrates the scale of the computational problem addressed by the present principles, consider a communication system with a desired user data rate of $\lambda$=1 Tb/s, a channel code with rate R=⅔, a channel output alphabet of size $2^{q=4}=16$, and an interconnect operating at a clock frequency of $f_c=1$ GHz. The required interconnect width is calculated as w=6000 using Eq. (1). If the receiver circuit generating the channel output y and the decoder are located on different chips, each chip has to have 6000 pins to get the data out from the receiver chip and onto the decoder chip. Providing such an interface on the chips may be prohibitively costly. Even when the receiver circuit and the decoder are located on the same chip, a 6000-bit on-chip data bus would consume significant area and power. A thorough discussion of the technical challenges relating to providing large interconnects for inter-chip or intra-chip communications can be found in [ZABIN].

In one embodiment of the present principles the complexity of communicating the channel output from the channel to the decoder is reduced by applying syndrome decoding methods and/or compressing the channel output using source coding methods. In a preferred embodiment of the present principles, a syndrome decoder for polar code is used. The present principles are applicable in combination with any type of decoding algorithm for polar codes, including successive cancellation decoding and successive cancellation list-decoding with or without CRC. The present principles are applicable to polar codes with puncturing and/or shortening.

The present disclosure foresees that, in addition to the conventional decoding applications described above, the present principles can be applied in client-server type architectures where a specialized processing unit designated as a decode server serves multiple decode clients. In one embodiment of the present principles in the client-server architecture, the decode server is located in a cloud and multiple decode clients are connected to the decode server over a communication network, such as the Internet, a 4G or 5G cellular network, or a Wi-Fi network. In another client-server type embodiment, the decode server and the decode clients are located on the same chip and the communication takes place over a network on chip. This latter type of embodiment is useful in a system-on-chip (SoC) type design where multiple channel codes need to be supported, such as the support of LTE and Wi-Fi standards, by a single chip located inside a mobile hand-set.

The present principles can be applied to reduce the volume of data from the decode clients to the decode server. An added advantage of the present principles is that the decode server does not gain access to the user data; this type of privacy is important if the cloud is not trustable.

REFERENCES

[AMDAH] Amdahl, G. M. (1967) 'Validity of the Single Processor Approach to Achieving Large Scale Computing Capabilities', in *Proceedings of the April 18-20, 1967, Spring Joint Computer Conference*. New York, N.Y., USA: ACM (AFIPS '67 (Spring)), pp. 483-485. doi: 10.1145/1465482.1465560.

[BETZE] Betzel, F. et al. (2018) 'Approximate Communication: Techniques for Reducing Communication Bottlenecks in Large-Scale Parallel Systems', *ACM Comput. Surv.*, 51(1), pp. 1:1-1:32. doi: 10.1145/3145812.

[DAMBR] D'Ambrosia, J. (2010) '100 gigabit Ethernet and beyond', *IEEE Communications Magazine*, 48(3), pp. S6-S13. doi: 10.1109/MCOM.2010.5434372.

[ESMAE] Esmaeilzadeh, H. et al. (2011) 'Dark silicon and the end of multicore scaling', in 2011 *38th Annual International Symposium on Computer Architecture (ISCA)*, pp. 365-376.

[ETHER] 'The 2018 Ethernet Roadmap'. Available at: https://ethernetalliance.org/the-2018-ethernet-roadmap/ (Accessed: 8 Jun. 2018).

[GHASE] Ghasempour, Y. et al. (2017) 'IEEE 802.11ay: Next-Generation 60 GHz Communication for 100 Gb/s Wi-Fi', *IEEE Communications Magazine*, 55(12), pp. 186-192. doi: 10.1109/MCOM.2017.1700393.

[HDRW] *IEEE 802.15.3d-2017-IEEE Standard for High Data Rate Wireless Multi-Media Networks Amendment 2: 100 Gb/s Wireless Switched Point-to-Point Physical Layer*. Available at: https://standards.ieee.org/findstds/standard/802.15.3d-2017.html (Accessed: 8 Jun. 2018).

[LAW] Law, D. et al. (2013) 'Evolution of Ethernet standards in the IEEE 802.3 working group', *IEEE Communications Magazine*, 51(8), pp. 88-96. doi: 10.1109/MCOM.2013.6576344.

[NIKOL] Nikolic, B. (2008) 'Design in the Power-Limited Scaling Regime', *IEEE Transactions on Electron Devices*, 55(1), pp. 71-83. doi: 10.1109/TED.2007.911350.

[ZABIN] Zabinski, P. J., Gilbert, B. K. and Daniel, E. S. (2013) 'Coming Challenges with Terabit-per-Second Data Communication', *IEEE Circuits and Systems Magazine*, 13(3), pp. 10-20. doi: 10.1109/MCAS.2013.2271441.

The above-listed publications are incorporated herein by reference.

SUMMARY

In one embodiment, a decode client apparatus is provided for use in a communication system for reliable transfer of a transmitted message from a source to a destination. A channel encoder within the communication system encodes the transmitted message into a transmitted codeword from a channel code and transmits the transmitted codeword over a channel for the communication system and the channel produces a channel output in response to the transmitted codeword. The decode client apparatus includes a hard decisions and error side information (HD/ESI) generator configured to receive the channel output and generate hard decisions and error side information. An error syndrome generator is configured to generate an error syndrome from the hard decisions and send the error syndrome to a decode server. An error side information compressor is configured to generate a compressed error side information from the error side information and send the compressed error side information to the decode server. An error estimate decompressor configured to receive, from the decode server, a compressed error estimate, and generate an error estimate. An error corrector configured to generate a message estimate from the hard decisions and the error estimate. The HD/ESI generator may apply quantization to the channel output prior to generating the hard decisions and the error side information. The error side information may be one of null error side information and non-null error side information, wherein the error side information compressor is not employed if the error side information is a null error side information and only the error syndrome is sent to the decode server by the decode client.

In another embodiment, a decode client method is provided for use in a communication system for reliable transfer of a transmitted message from a source to a destination, wherein a channel encoder encodes the transmitted message into a transmitted codeword from a channel code and transmits the transmitted codeword over a channel for the communication system and the channel produces a channel output in response to the transmitted codeword. The decode client method includes receiving the channel output at a hard decisions and error side information (HD/ESI) generator and generating hard decisions and error side information. The decode client method also includes generating, at an error syndrome generator, an error syndrome from the hard decisions and sending the error syndrome to a decode server. The decode client method further includes generating, at an error side information compressor, a compressed error side information from the error side information and sending the compressed error side information to the decode server. The decode client method still further includes receiving, from a decode server, a compressed error estimate and generating an error estimate at the decode client. The decode client method additionally includes generating, at an error corrector, a message estimate from the hard decisions and the error estimate. The HD/ESI generator may apply quantization to the channel output prior to generating the hard decisions and the error side information. The error side information may be one of null error side information and non-null error side information, wherein the error side information compressor is not employed if the error side information is a null error side information and only the error syndrome is sent to the decode server by the decode client.

In yet another embodiment, a multi-client split decoder system for carrying out channel decoding includes a plurality of decode clients in a client-server architecture subject to privacy constraints, wherein an ith decode client among the plurality of decode clients is configured to receive an ith channel output from an ith channel, wherein the ith channel output is a corrupted version of an ith transmitted codeword from an ith channel code, wherein the ith transmitted codeword is obtained from an ith transmitted message, wherein the ith decode client is further configured to generate an ith compressed error information from the ith channel output, wherein the ith compressed error information is independent of and contains no information about an ith transmitted message, and send the ith compressed error information over a communication network to a decode server. The ith decode client is configured to receive, from the communication network, an ith compressed error estimate generated by the decode server, and to generate an estimate of the ith transmitted message without the decode server learning any information about the ith transmitted message.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware together with either or both of software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A; B; C; A and B; A and C; B and C; and A, B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this disclosure. Those of ordinary skill in the art should understand that in many if not most instances such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
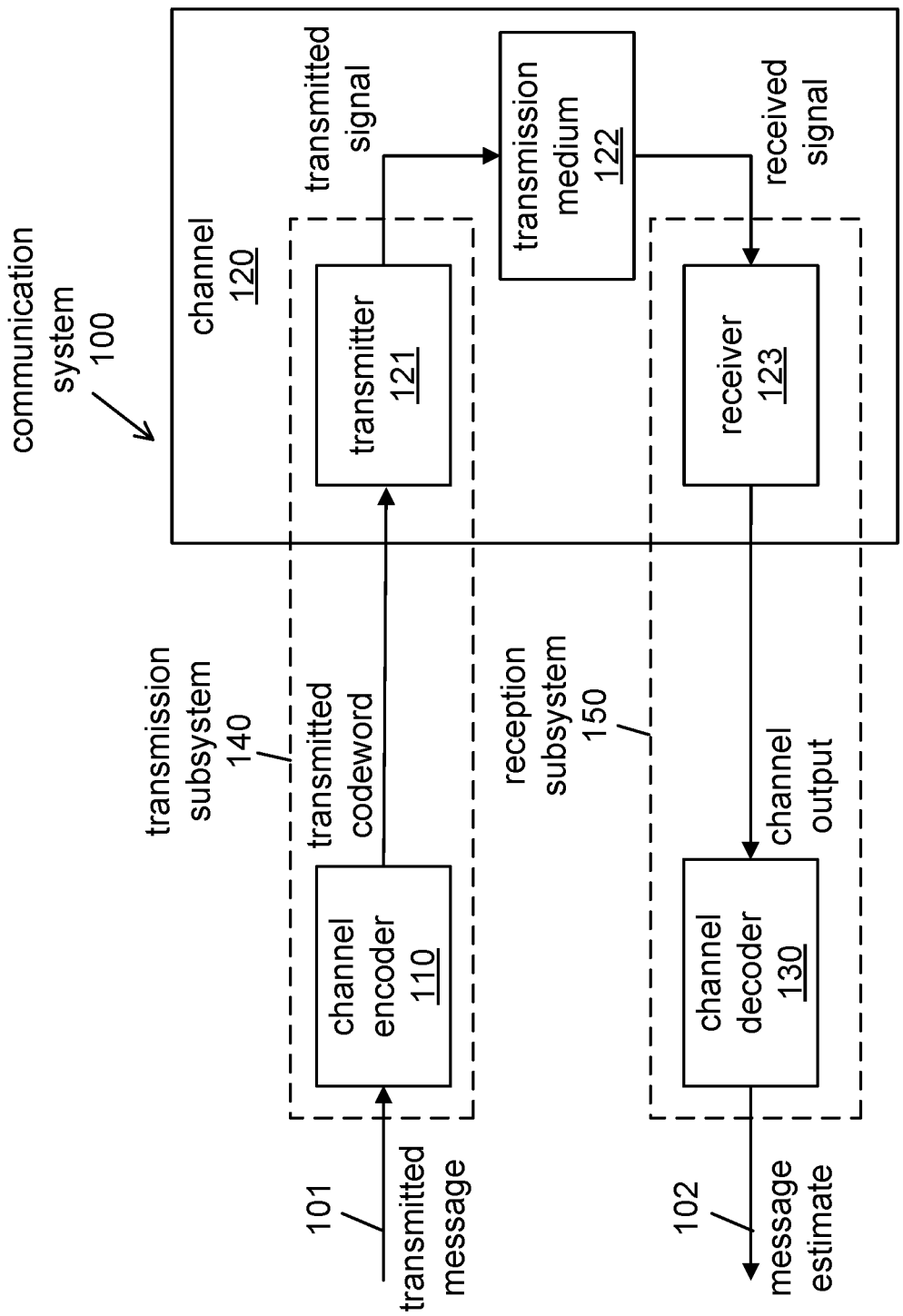
FIG. 1 is a functional block diagram of a communication system for data transmission in which the present principles may be employed.

FIGS. 1 through 8B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

In the following description, sets are denoted by script capital letters such as $\mathcal{A}$, $\mathcal{B}$. For any set $\mathcal{A}$, the notation $|\mathcal{A}|$ denotes the number of elements in $\mathcal{A}$; the notation $\mathcal{A}^c$ denotes the complement of $\mathcal{A}$ in a specified universal set.

In accordance with established conventions in coding theory, data words and codewords in the system are represented as vectors over a finite field $\mathbb{F}$. Field elements (scalars) are denoted by plain lower case letters, such as $a \in \mathbb{F}$. Vectors are denoted by lower-case italic boldface letters, such as a and the notation $a \in \mathbb{F}^N$ is used to indicate that a is an N-dimensional vector over a finite field F. The elements of a vector of length N are indexed with integers 1,2, ... N and a vector $a \in \mathbb{F}^N$ is denoted in terms of its elements as $a=(a_1, a_2, \ldots a_N)$. Matrices over a field are denoted by upper-case italic boldface letters, such as $A \in \mathbb{F}^{M \times N}$, where M denotes the number of rows and N denotes the number of columns of A. A vector whose components are all zero (an all-zero vector) is denoted by 0, with the dimension of 0 inferred from the context.

Given a vector $x=(x_1, x_2, \ldots, x_N)$ and a subset of coordinate indices $\mathcal{S} \sqsubset \{1,2, \ldots, N\}$, the notation x $\mathcal{S}$ denotes the sub-vector $(x_{i_1}, x_{i_2}, \ldots, x_{i_n})$ where $\{i_1, i_2, \ldots, i_n\}$ is a listing of the elements of $\mathcal{S}$ in natural (increasing) order. For example, if $x=(1, 2, 3, 4, 5)$ and $\mathcal{S}=\{4, 1, 2\}$, $x\mathcal{S}=(1, 2, 4)$.

Shannon's notions of entropy and mutual information are key concepts in the present disclosure. The entropy of a discrete random variable X with a probability mass function (PMF) p(x) is defined as $H(X)=-\Sigma_x p(x) \log p(x)$. The mutual information between two random variables (X, Y) with a joint PMF p(x, y) is defined as $$I(X;Y) = \sum_{x,y} p(x, y) \log \frac{p(x, y)}{p(x)p(y)}.$$

For $0<a<1$, the notation h(a) denotes the binary entropy function $h(a)=-a \log(a)-(1-a)\log(1-a)$.

In the following description, specific details such as particular embodiments, procedures, techniques, etc., are set forth for purposes of explanation, in order to provide a thorough understanding of the present principles, and not limitation. However, it will be apparent to one skilled in the art that the present principles may be practiced in other embodiments that depart from the specific details herein. For example, the present principles may be implemented in any data communications system between any data transmitter and data receiver, e.g., see FIG. 1. One specific, non-limiting application of the present principles is in a wireless communications system, e.g., see FIGS. 7 and 8A-8B.

Some of the figures contain individual function blocks without detailed explanation of the construction and operation of the hardware circuits used for their implementation. Whenever such details are omitted, it will be the case that those skilled in the art will be able to appreciate that the functions are implemented at least to some degree by hardware circuits, and may be implemented using individual hardware circuits, using software functioning in conjunction with a suitably programmed digital microprocessor or general purpose computer, using an application specific integrated circuit (ASIC), and/or using one or more digital signal processors (DSPs).

With the above in mind, initially referring to FIG. 1, a communication system 100 is shown in which embodiments of a system for decoding data using compressed channel output information according to embodiments of the present disclosure may be used. As shown, the communication system 100 includes a channel encoder 110, a channel 120, and a channel decoder 130. The channel 120 comprises a transmitter 121, a transmission medium 122, and a receiver 123. The channel encoder 110 receives a transmitted message 101 and encodes the transmitted message 101 into a transmitted codeword from a channel code. The transmitter 121 receives the transmitted codeword, modulates the transmitted codeword into a transmitted signal, and sends the transmitted signal into the transmission medium 122. The transmission medium 122 produces a received signal at its output in response to the transmitted signal. The receiver 123 receives the received signal, demodulates it, and produces a channel output. The decoder 130 receives the channel output and produces a message estimate 102.

It will readily be appreciated that the receiver 123 and channel decoder 130 perform the inverse of the operations performed by the transmitter 121 and channel encoder 110, respectively, subject to limitations imposed by noise effects and other non-idealities in the system. In any case, if the communication system 100 is properly designed and operated within its design parameters, the message estimate 102 should match the transmitted message 101 with high reliability. Indeed, the main goal of the communication system 100 is to reproduce the transmitted message 101 as the message estimate 102 without any errors. If the message estimate 102 is not equal to the transmitted message 101, a frame error is said to occur. A key performance metric for the communication system 100 is the frame error rate (FER), defined as the probability of a frame error event.

It is to be understood that present principles apply to various transmission systems and media. For example, in a wireless communication system, the transmission medium 122 is typically space or atmosphere, in which case the communication system 100 is a wireless communication system. In such embodiments, the transmitter 121 and receiver 123 each include antenna(s) coupled respectively to the transmitter 121 and receiver 123. However, other embodiments of the present disclosure may be implemented in wired communications systems, in which case the transmission medium 122 may be a cable or a wire that connects the transmitter 121 to the receiver 123. Embodiments of the present disclosure may also be implemented for storage systems, in which case the transmission medium 122 may be a magnetic tape, a hard disk drive, an optical disk drive, a solid state memory, or another storage medium In the description above, the modulation operation has been regarded as part of the transmitter 121 and the demodulation operation as part of the receiver 123. Details of the modulation and demodulation operations have been omitted in order not to clutter the description with unnecessary detail. Modulation is the operation of mapping a (discrete-time discrete-amplitude) sequence of symbols (such as the elements of a codeword) into a physical waveform that is capable of being transmitted over the transmission medium 122. Demodulation is the inverse operation of processing the output of the transmission medium 122 to generate a (discrete-time, discrete or continuous amplitude) channel output. Ideally, the channel output contains all the relevant information about the transmitted codeword that is available in the received signal. A skilled person in the art will have no difficulty in implementing the present principles together with various modulation schemes such as Phase Shift Keying (PSK), Pulse Amplitude Modulation (PAM), or Quadrature Amplitude Modulation (QAM).

From an implementation viewpoint, the components of the communication system 100 can be grouped into a transmission subsystem 140 and a reception subsystem 150. The transmission subsystem comprises the channel encoder 110 and the transmitter 121. The reception subsystem comprises the receiver 123 and the channel decoder 130. According to the present principles, each component 110 and 121 of the transmission subsystem 140 and each component 123 and 130 of the reception subsystem 150 comprises electrical circuits and may be implemented on its own respective semiconductor chip, with the various chips communicating with each other according to the system of FIG. 1. Alternatively, one semiconductor chip may bear all or multiple components of the transmission system, and a second semiconductor chip may bear all or multiple components of the reception system. Such chips may implement a circuit of logic gates such as those described herein. Yet again, a processor such as a digital signal processor (DSP) comprising electrical circuits and accessing logic implemented in hardware (optionally programmed by software or firmware) may execute the function(s) of one or more of the components of each of the transmission system 140 and (on a separate processor) the reception system 150. If software forms part of the implementation of the processor(s) (in addition to hardware in the form of digital logic and analog signal processing electrical circuits), the software is stored on a computer readable storage medium such as but not limited to disk-based or solid state storage such that a machine such as a DSP executes method steps according to the logic. In any case, when the channel decoder 130 is implemented on a semiconductor chip, the circuitry of the chip establishes a decoding circuit in accordance with description herein. Similarly, when the channel decoder 130 is implemented by a processor accessing hardware-embodied logic (or, optionally, software-embodied logic programming of hardware logic), the processor with logic establishes a circuit which defines a channel decoder in accordance with description herein. A combination of the above implementations may be used.

The technical problem addressed by the present principles is a speed mismatch between the desired data transmission rates $\lambda$ over the channel 120 and the clock frequency $f_c$ used by the digital circuitry in the communication system 100. The speed mismatch problem was discussed above and Eq. (1) was used to estimate the minimum bus width w required at the receiver side. The present principles target applications in which the speed mismatch is large enough that the required bus width w and the associated digital circuitry become a major implementation bottleneck. For example, Eq. (1) predicts that for near-future systems, with the data rate $\lambda$ approaching Tb/s and the clock frequency $f_c$ remaining at around 1 GHz, the bus width w will have to be in the thousands. Such large data buses may be prohibitive in terms of cost and complexity. The present principles propose solutions to this problem in the context of channel decoding by taking advantage of the special characteristics of the channel decoding problem.

An important design consideration for reducing the communications complexity in the implementation of the reception subsystem 150 is to decide where and how to apply data compression to reduce data traffic inside the reception subsystem 150. Compression may be employed as part of the receiver 123 in order to reduce the communication complexity from the receiver 123 to the channel decoder 130. Further compression may be employed inside the channel decoder 130 to reduce the communications complexity in the implementation of the channel decoder 130. The present disclosure introduces a split decoder architecture that provides greater flexibility in implementing the interface between the receiver 123 and the channel decoder 130. The split decoder architecture advocates a joint optimization of the receiver and decoder functions so as to reduce communications complexity without a significant degradation in the decoder performance.

Figure 2:
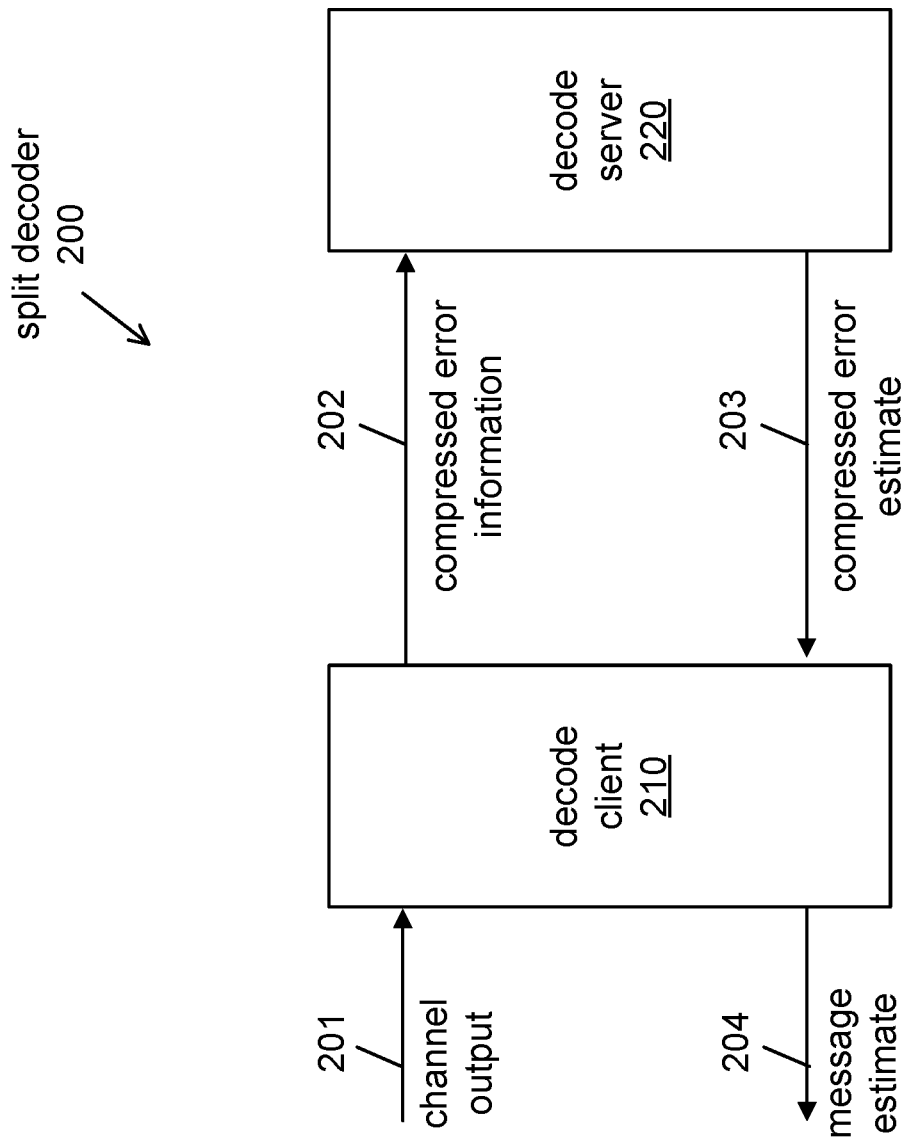
FIG. 2 is a functional block diagram of a channel decoder in which the decoder functions are split into two functional blocks, called a decode client and a decode server, so as to reduce the communication complexity between the two blocks.

Turning to FIG. 2, a split decoder 200 is shown which serves as an architectural template for introducing compression methods into the implementation of the channel decoder 130. The split decoder 200 comprises a decode client 210 and a decode server 220. The decode client 210 receives a channel output 201 and generates a compressed error information 202. The operation by the decode client may comprise a quantization function prior to the generation of the compressed error information 202. The decode server 220 receives the compressed error information 202 and generates a compressed error estimate 203. The decode client 210 receives the compressed error estimate 203 and generates a message estimate 204.

The split decoder 200 has an architecture that is designed to reduce the data traffic among the functional blocks 210 and 220. This goal is achieved by using syndrome decoding methods that estimate the error introduced by the channel rather than directly estimating the transmitted message. Some well-known channel codes for which syndrome decoding methods are available include Bose-Chaudhuri-Hocquenghem (BCH) codes, Reed-Muller (RM) codes, Reed-Solomon (RS) codes, and Low-Density Parity-Check (LDPC) codes. For BCH codes and RS codes, well known syndrome decoding methods exist, such as the Berlekamp-Massey algorithm. For LDPC codes, belief-propagation (BP) decoding may be used as a syndrome decoding method.

A newer type of channel code is a polar code. Polar codes are linear block codes as described in the reference "Arikan, E. (2009) 'Channel Polarization: A Method for Constructing Capacity-Achieving Codes for Symmetric Binary-Input Memoryless Channels', IEEE Transactions on Information Theory, 55(7), pp. 3051-3073". The present principles can be used with polar codes. Polar codes have the advantage of having low-complexity encoding and decoding algorithms. The present description discloses a syndrome decoding algorithm for polar codes derived from the reference "Arikan, E. (2010) 'Source polarization', in 2010 *IEEE International Symposium on Information Theory Proceedings (ISIT)*, IEEE, pp. 899-903".

The present principles can be applied with both systematic and non-systematic channel codes. The channel encoder 110 is called systematic if the transmitted message appears as part of the transmitted codeword. If the channel encoder 110 is not systematic, it is called non-systematic. The implementation of the split decoder 200 depends on whether the channel encoder is systematic or not. In general, systematic coding provides greater reduction in both the computational and communications complexity at the split decoder 200. Specific embodiments of the present principles given below will illustrate the use of syndrome decoding together with both systematic and non-systematic coding.

A further advantage of the split decoder 200 architecture is that it can be used to ensure that the decode server 220 does not learn anything about the transmitted message. In preferred embodiments of the present principles, discussed below, the decode server 220 is presented only with an information about the channel error and the information about the channel error carries no information about the transmitted message.

In order to derive the greatest possible benefit from the present principles, some functions of the decode client 210 should be implemented in close proximity to or as an integral part of the receiver 123. Chief among such functions is the quantization function of the decode client 210 which overlaps to a great extent with the demodulation function located inside the receiver 123. The demodulator need not produce fine-resolution output if such output will have to be quantized to a coarser level by the decode client 210 in order to control the communications complexity. Merging the quantization function of the decode client with that of demodulator can eliminate unnecessary complexity. Although this is the preferred approach, the description that follows makes room for separate quantization functions at the receiver 123 and the decode client 210. Having two separate quantizers may be unavoidable in situations where the receiver 123 is inaccessible from outside, as would be the case if the receiver is implemented on a separate chip.

Figure 3:
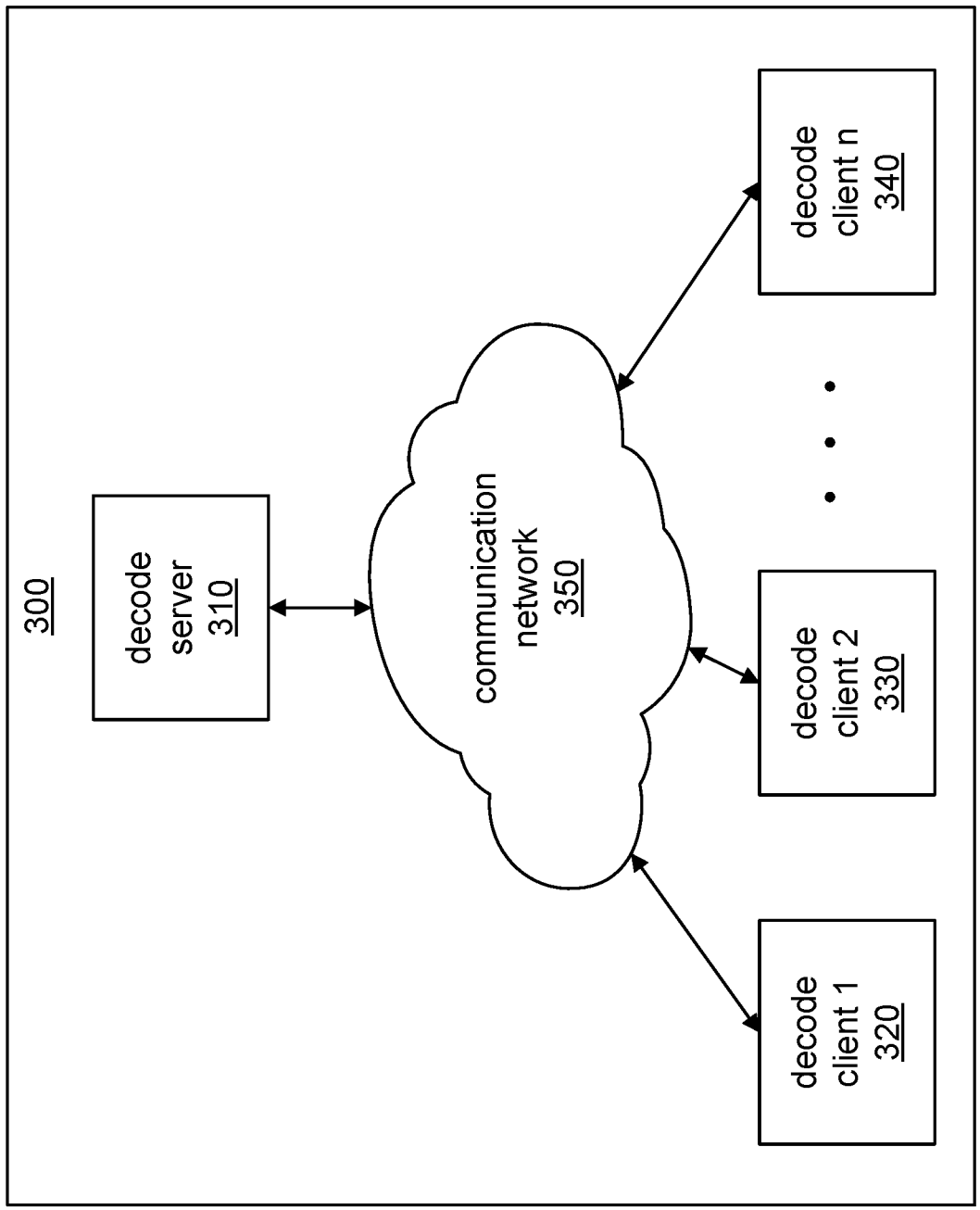
FIG. 3 is a picture of a client-server configuration in which a decode server is shared among a plurality of decode clients.

Turning to FIG. 3, a multi-client split decoder 300 is shown which illustrates the advantages the split decoder architecture of FIG. 2. The multi-client split decoder 300 comprises a decode server 310 and a plurality of decode clients 320, 330, 340. The plurality of decode clients and the decode server communicate with each other over a communication network 350. The communication network may be a wide area network such as the Internet, a local area network, or a network on a card, or a network on a chip. This networked architecture allows the sharing of a single decode server among a plurality of decode clients so as to provide cost reduction. In sharing a common decode server, privacy of the transmitted message 101 may be a concern. For example, if the decode client is located in a public cloud, maintenance of the privacy is a critical issue. The present principles ensure such privacy by presenting to the decode server a compressed error information 202. In preferred embodiments of the present principles discussed below, the compressed error information 202 is independent of the transmitted message 101, thus ensuring that privacy is preserved in a fundamental sense.

Figure 4:
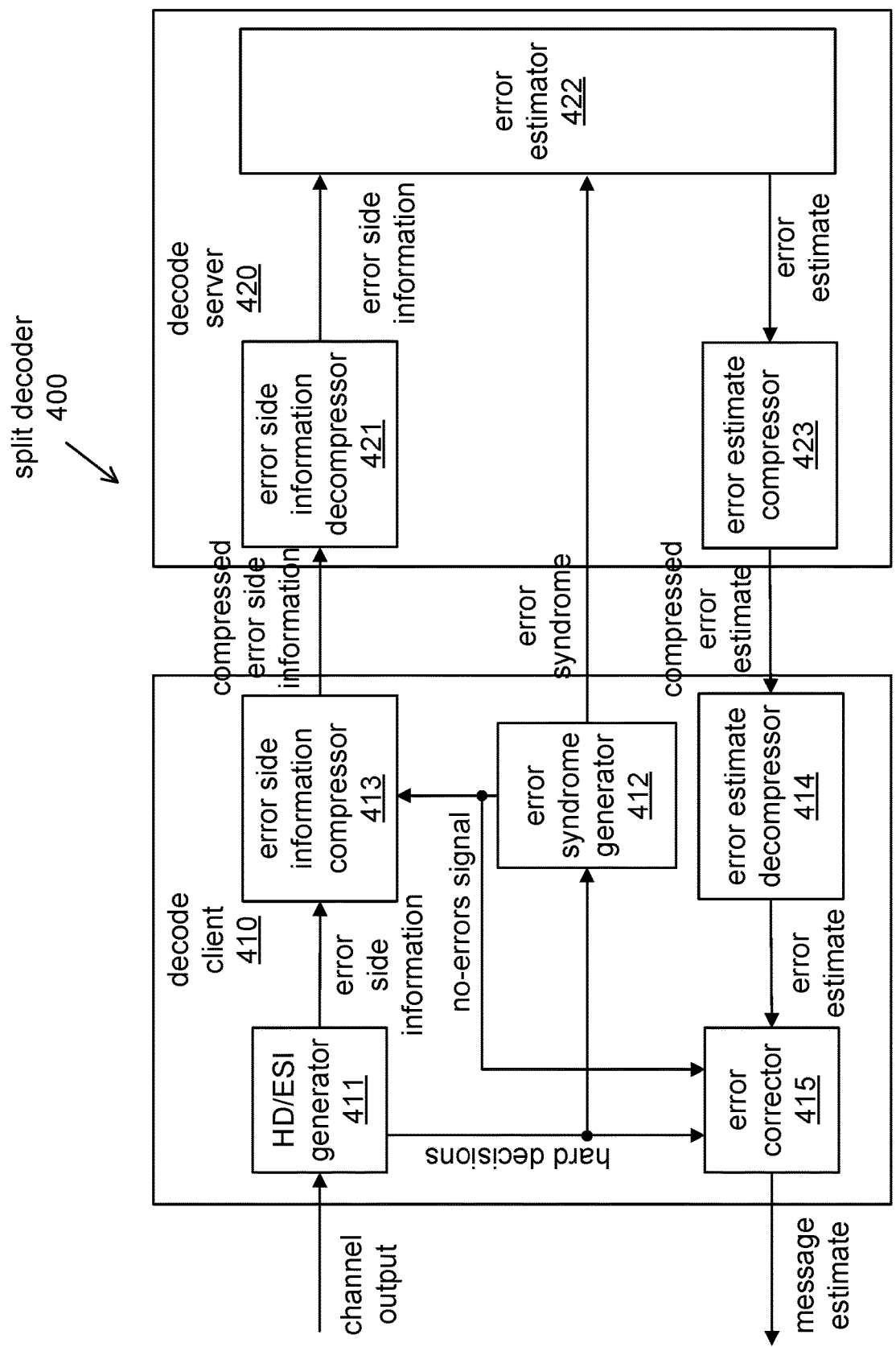
FIG. 4 is a functional block diagram of a preferred embodiment a channel decoder in accordance with the architecture of FIG. 2.

Turning to FIG. 4, details of a split decoder 400 constructed in accordance with the general architecture of FIG. 2 are shown. The split decoder 400 comprises a decode client 410 and a decode server 420 as the main functional blocks. The decode client 410 comprises a hard decisions and error side information (HD/ESI) generator 411, an error syndrome generator 412, an error side information compressor 413, an error estimate decompressor 414, and an error corrector 415.

The HD/ESI generator 411 receives a channel output and generates hard decisions and error side information. According to the present principles, the hard decisions are intended to serve as an initial estimate of the transmitted codeword. The hard decisions are a string of symbols over a finite alphabet, typically, the same as the alphabet for the transmitted codeword. The error side information is intended to serve as a measure of confidence about the accuracy of the hard decisions. Ideally, the measure of confidence for each individual hard decision is the probability of that hard decision being in error, or something equivalent to this probability. In order to have control over the communications complexity, present principles restrict the alphabet for the error side information, denoted $\mathcal{L}$ henceforth, to finite sets. Typically, the set $\mathcal{L}$ is a set of integers, each integer serving as an index to a specific posterior distribution on the error committed in a specific hard decision.

The error syndrome generator 412 receives the hard decisions and checks if the hard decisions correspond to a valid codeword in the channel code employed by the communication system 100. The error syndrome generator 412 sets a no-errors signal to 1 or 0 depending on whether the hard decisions correspond to a valid codeword or not, respectively. If the no-errors signal is 1, the error syndrome generator 412 does not send anything to the decode server 420. If the no-errors signal is 0, the error syndrome generator 412 sends an error syndrome to the decode server 420. The error syndrome generator 412 may calculate the error syndrome as a first step of checking whether the hard decisions correspond to a valid codeword. In some cases, the error syndrome generator 412 may exploit additional redundancies that are built into the transmitted codeword to decide if the hard decisions correspond to a valid codeword. The additional redundancies may take the form of a cyclic redundancy check (CRC) that is computed as a function of the transmitted data and inserted into the codeword.

The error side information compressor 413 waits for the no-errors signal from the error syndrome generator 412. If the no-errors signal is 1, the error side information compressor 413 does not send anything to the decode server 420. If the no-errors signal is 0, the error side information compressor 413 receives the error side information from the HD/ESI generator 411, compresses the error side information to generate a compressed error side information, and sends the compressed error side information to the decode server 420. The error syndrome and the compressed error side information comprise the compressed error information 202 in FIG. 2.

The decode server 420 comprises an error side information decompressor 421, an error estimator 422, and an error estimate compressor 423. The decode server waits for the error syndrome and the compressed error side information before beginning a new decoding operation. (If the no-errors signal is 1, the decode client 410 does not become active in that decoding cycle.) Once the error syndrome and the compressed error side information arrive, the decode server 420 is activated. (The activation of the decode server is carried out by a controller circuit which is not shown in FIG. 2 since the construction of such a controller in accordance with the present disclosure is a routine design task for a person skilled in the art.) The error side information decompressor 421 receives the compressed error side information and regenerates the error side information. The error estimator 422 receives the error side information from the error side information decompressor 421 and the error syndrome from the error syndrome generator 412 and generates an error estimate. The error estimate compressor 423 receives the error estimate and compresses it to generate a compressed error estimate. The error estimate decompressor 414 receives the compressed error estimate and decompresses it to regenerate the error estimate.

The error corrector 415 has two modes of operation depending on the no-errors signal being 1 or 0. If the no-errors signal is 1, the error corrector 415 proceeds to generate a message estimate by assuming that the hard decisions form a correct estimate of the transmitted codeword. If the no-errors signal is 0, the error corrector 415 waits for the error estimate to arrive from the error estimate decompressor 414, and after receiving the error estimate proceeds to generate a message estimate.

In preferred embodiments of the present principles, the error side information compressor 413 and the error estimate compressor 423 carry out lossless data compression. Lossless compression is reversible; the compressed data can be recovered exactly by a suitable decompressor. For lossless compression a suitable algorithm is arithmetic coding, as described, e.g., in the reference "Howard, P. G. and Vitter, J. S. (1994) 'Arithmetic coding for data compression', *Proceedings of the IEEE*, 82(6), pp. 857-865".

In preferred embodiments of the present principles, the HD/ESI generator 411 may optionally apply quantization (lossy data compression) as part of the generation of the error side information. Quantization is not reversible; some information is permanently lost after quantization. Quantization is used in order to reduce the communications complexity to a level that can be supported by the available decoder circuitry. As mentioned above in connection with the general description of the decode client 210 in FIG. 2, if the decode client comprises a quantization function, it is preferable to integrate such function with the quantization function in the receiver 123. In that case, the HD/ESI generator 411 may be implemented as part of the receiver 123. If such integration of the quantization functions is not possible, then the quantization function of the HD/ESI generator 411 should be implemented as close to the receiver 123 as possible so as to minimize the length of the data bus between the two modules.

The present principles offer significant advantages (as will be illustrated in the following text) in reducing the communications complexity by avoiding unnecessary transfer of bulk data among the various functional building blocks of the channel decoder 130. The split decoder 400 architecture is designed to achieve savings in communications complexity by keeping data local as much as possible, and transferring data only when it is necessary, and using compression to reduce the data traffic still further.

The penalty paid for reducing the communications complexity as prescribed by the present principles is the need for using data compression and decompression, which adds to the computational complexity of the overall system. The error estimator 422 has computational complexity comparable to that of an ordinary decoder and does not increase or decrease materially the computational complexity of the overall system. In return for the increased computational complexity due to the use of data compression and decompression, the present principles require significantly smaller number of communications resources, as measured by the number of lanes in on-chip data buses or the number of input/output (I/O) pins at chip-to-chip interfaces. This tradeoff between computational and communications complexity in the application of the present principles will be illustrated by specific embodiments and examples of the present principles.

A First Preferred Embodiment of the Present Principles

Initially looking at FIG. 1, the first preferred embodiment is applicable when the channel 120 is a Binary-Input Memoryless Channel (BMC for short), i.e., a channel with a binary input alphabet $\chi$, an arbitrary output alphabet $\mathcal{Y}$, and an arbitrary set of channel transition probabilities $\{W(y|x): x \in \chi, y \in \mathcal{Y}\}$. In the following description of the first preferred embodiment, it is assumed that the channel 120 is a BMC with the input alphabet $\chi = \{0,1\}$. Both discrete and continuous cases will be considered for the output alphabet $\mathcal{Y}$. When $\mathcal{Y}$ is discrete, $W(y|x)$ will be a conditional probability mass function on $\mathcal{Y}$; when $\mathcal{Y}$ is continuous, $W(y|x)$ will be a conditional probability density function on $\mathcal{Y}$.

In the first preferred embodiment, the channel code employed by the communication system 100 is a linear block code over the binary field $\mathbb{F}_2 = \{0,1\}$. The transmitted message 101, which is the input to the channel encoder 110, is a row vector $d = (d_1, d_2, \ldots, d_K)$ from $\mathbb{F}_2^K$ and the transmitted codeword is a row vector $x = (x_1, x_2, \ldots, x_N)$ from $\mathbb{F}_2^K$. The channel encoder 110 in effect carries out the matrix multiplication $x = dG$, where G is a generator matrix (with K rows and N columns) for the linear code under consideration. The matrix operations are in the field $\mathbb{F}_2$. The integers K and N are arbitrary integers subject only to the condition $1 \leq K \leq N$. The ratio $R = K/N$ is the code rate.

The transmitted codeword x is sent over the channel 120 and a channel output $y = (y_1, y_2, \ldots, y_N)$ is received at the output of the channel 120. The channel decoder 130 in the first preferred embodiment processes the channel output y and generates a message estimate $\hat{d} = (\hat{d}_1, \hat{d}_2, \ldots, \hat{d}_K)$. A frame error occurs if the message estimate $\hat{d}$ differs from the transmitted message d in at least one coordinate. The present principles aim to provide a reduction in communications complexity without a significant degradation in the FER performance.

To specify further details of the channel decoder 130 in the first preferred embodiment, attention is now turned to FIG. 4. In the present context, the HD/ESI generator 411 receives the channel output $y = (y_1, y_2, \ldots, y_N)$ and computes a log likelihood ratio (LLR) vector $l = (l_1, l_2, \ldots, l_N)$ so that $$l_i = \log \frac{W(y_i \mid 0)}{W(y_i \mid 1)}$$

for $i = 1, 2, \ldots, N$. From the LLR vector, the HD/ESI generator 411 generates a hard decisions vector $z = (z_1, z_2, \ldots, z_N)$ by setting $z_i = 0$ if $l_i > 0$ and $z_i = 1$ if $l_i \leq 0$. Also from the LLR vector, the HD/ESI generator 411 further generates an error side information vector $m = (m_1, m_2, \ldots, m_N)$ by setting $m_i = |l_i|$, where $|l_i|$ denotes the magnitude of $l_i$.

An error vector $e = (e_1, e_2, \ldots, e_N)$ is defined as $e = z - x$ where the subtraction is in the binary field $\mathbb{F}_2$. The side information m is interpreted as an LLR for the errors e in the sense that $$m_i = \log \frac{P(e_i = 0)}{P(e_i = 1)}.$$

The error syndrome generator 412 uses the hard decisions vector z to generate an error syndrome vector $s = (s_1, s_2, \ldots, s_{N-K})$ by computing $s = zH$ where H is a parity-check matrix for the linear block code under consideration. By definition of a parity-check matrix, $xH = 0$ for any codeword x. So, the error syndrome equals $s = zH = xH + eH = eH$, which shows that the error syndrome s depends only on the error vector e. If the syndrome is zero, $s = 0$, decoding is skipped by setting the no-errors signal to 1.

If the no-error signal is 1, the error corrector 415 produces the message estimate $\hat{d}=(\hat{d}_1, \hat{d}_2, \ldots, \hat{d}_K)$ by solving the equation $z=\hat{d}G$.

If the no-error signal is 0, the decode server 420 becomes active. The error estimator 422 produces an error estimate vector $\hat{e}=(\hat{e}_1, \hat{e}_2, \ldots, \hat{e}_N)$. The error estimate compressor 423 compresses ê to obtain a compressed error estimate and the error estimate decompressor 414 decompresses the compressed error estimate to obtain the error estimate ê back. The error corrector 415 receives the error estimate ê and produces the message estimate $\hat{d}=(\hat{d}_1, \hat{d}_2, \ldots, \hat{d}_K)$ by solving the equations $\hat{x}=\hat{d}G$ where $\hat{x}=(\hat{x}_1, \hat{x}_2, \ldots, \hat{x}_N)$ is the codeword estimate defined as $\hat{x}=z-\hat{e}$.

A Second Preferred Embodiment of the Present Principles

The second preferred embodiment of the present principles is the same as the first preferred embodiment, except the channel encoder 411 in the second preferred embodiment is systematic. In other words, there exists an information set $\mathcal{J} \subset \{1,2,\ldots,N\}$ with size K, $|\mathcal{J}|=K$, such that for every transmitted message d the corresponding transmitted codeword x satisfies $x\mathcal{J}=(x_i: i\in\mathcal{J})=d$. In other words, for systematic encoding, the transmitted message (a data word) appears transparently as part of the transmitted codeword.

Systematic coding is advantageous for the application of the present principles because the error corrector 415 can produce the message estimate simply by calculating $\hat{d}=z\mathcal{J}-\hat{e}\mathcal{J}$ where $z\mathcal{J}=(z_i: i\in\mathcal{J})$ and $\hat{e}\mathcal{J}=(\hat{e}_i: i\in\mathcal{J})$ are the systematic parts of the hard decisions and error estimates, respectively. Unlike the first preferred embodiment, there is no need to compute the message estimate $\hat{d}$ by solving the more complex set of equations $(z-\hat{e})=\hat{d}G$.

Furthermore, when the channel encoding is systematic, the error estimate compressor 423 need only compress the part $\hat{e}\mathcal{J}$ of the error estimate ê, which leads to further savings in communications complexity.

Example 1

This example illustrates the first preferred embodiment of the present principles in a simple context. The channel encoder 110 in this example is non-systematic. The channel 120 is a Binary Symmetric Channel (BSC), which is a special case of a BMC with $\chi=\mathcal{Y}=\{0,1\}$ and $W(0|0)=W(1|1)=1-\epsilon$, $W(1|0)=W(0|1)=\epsilon$, where e is a constant in the range $0\leq\epsilon\leq\frac{1}{2}$.

For a BSC, the LLRs have two possible values: $l_i=a$ if $y_i=0$ and $l_i=-a$ if $y_i=1$, where $$a = \log\frac{1-\epsilon}{\epsilon}$$

is a non-negative real number; in other words, $\mathcal{L}=\{-a, a\}$. The hard decisions are given by $z_i=y_i$ and the error side information by $m_i=a$.

Since the error side information m is constant, $m=(a, a, \ldots, a)$, the error side information compressor 413 and the error side information decompressor 421 in this example are redundant; they need not be implemented. The error estimator 422 can be configured to receive a locally generated copy of the constant error side information to carry out its task.

The rest of the system in Example 1 operates in accordance with the general rules that have been described above as part of the first preferred embodiment of the present principles.

In order to illustrate the advantages of the present principles, the communications complexity for Example 1 will be analyzed first in the direction from the decode client 410 to the decode server 420, then in the reverse direction.

Communications complexity from the decode client to the decode server. In this example, the compressed error side information is a null string. So, the number of bits that have to be communicated from the decode client 410 to the decode server 420 is equal to the length of the error syndrome s, i.e., $(N-K)=N(1-R)$ bits, where $R=K/N$ is the code rate. In a similar situation, the reception subsystem 150 would send N bits (the length of the channel output y) from the receiver 123 to the channel decoder 130. Thus, compared to the benchmark reception subsystem 150, the present principles improve the communications complexity by a factor of $(1-R)$. The improvement becomes especially significant for systems with a code rate R close to 1.

The factor of $(1-R)$ reduction in communication complexity translates directly to a similar savings in hardware complexity in terms of bus widths and chip interfaces. The benchmark reception subsystem 150, in which the receiver 123 and channel decoder 130 are separate entities, require a bus width $w=(\lambda/R)/f_c$ as given by Eq. (1) (with q=1). The required bus width for the split decoder 200 architecture is $w'=[\lambda(1-R)/R]/f_c$. The two bus widths are related by $w'=(1-R)w$.

In a terabit-per-second application with $\lambda=1$ Tb/s, $f_c=1$ GHz, and R=0.82, the required bus width is reduced from w=1220 to w'=220. The parameters used in this numerical example are typical of the type of emerging application scenarios that are targeted by the present principles.

There are many examples of communication systems where R is close to 1. For example, in optical communications, the G.709 standard uses Reed-Solomon codes with a code rate R≈0.94, and the newer standard G.975.1 specifies various codes, such as BCH and LDPC codes, with rates in the range 0.82 to 0.94. Another example is the recent IEEE 802.15.3d standard for High Data Rate Wireless Multi-Media Networks that uses LDPC codes with code rates 11/15 and 14/15. The present principles reduce the data traffic volume from the receiver 123 to the channel decoder 130 by 82% to 94% when applied to such systems.

Communications complexity from the decode server to the decode client. In the reverse direction, the error estimate compressor 423 sends a compressed version of the error estimate vector $\hat{e}=(\hat{e}_1, \hat{e}_2, \hat{e}_N)$. The error estimate vector is likely to be a sparse (hence, highly compressible) vector for a well-functioning communication system since errors will occur rarely. To illustrate that sparse vectors are highly compressible, a simulation study was performed in which 100 randomly chosen samples of the error estimate vector $\hat{e}=(\hat{e}_1, \hat{e}_2, \ldots, \hat{e}_N)$ with N=1000 were compressed using arithmetic coding. The samples of ê were chosen so that each sample contained exactly 3 ones (and 997 zeros) in random locations. The average length of the compressed error estimates was 40.76 bits, with actual lengths after compression being 40 or 41. Thus, compression by arithmetic coding reduced the communications complexity from the decode server to decoder client to negligible levels.

Example 2

This example is intended to illustrate the further advantages of using systematic encoding, as in the second preferred embodiment of the present principles. This example is the same as Example 1 in every respect, except here the channel encoder 110 is systematic. The communication complexity from the decoder client 410 to the decode server 420 is the same as in Example 1. In the reverse direction, the communication complexity in Example 2 is smaller than that in Example 1 since the error estimate compressor 423 here sends only the systematic part $\hat{e}\mathcal{J}$ of the error estimate $\hat{e}$. This corresponds roughly to a factor of R savings in the communications complexity.

A further advantage of systematic coding is that the error corrector 415 can generate the message estimate $\hat{d}$ simply by calculating $\hat{d}=z\mathcal{J}-\hat{e}\mathcal{J}$. Unlike Example 1, there is no need to solve $(z-\hat{e})=\hat{d}G$.

Example 3

In Examples 1 and 2, the error side information was null. This example illustrates the case where the error side information is not null. The BMC W in this example has output alphabet $\mathcal{Y}=\{0, 1, 2, 3\}$ and transition probabilities $W(0|0)=W(1|1)=a(1-\epsilon)$, $W(1|0)=W(0|1)=a\epsilon$, $W(2|0)=W(3|1)=(1-a)(1-\delta)$, $W(3|0)=W(2|1)=(1-a)\delta$ where a, $\epsilon$, and $\delta$ are real numbers satisfying $0<a<1$ and $0<\epsilon<\delta<\frac{1}{2}$.

The LLRs take values in the alphabet $\mathcal{L}=\{-b, -a, a, b\}$ where $$a = \log \frac{1-\epsilon}{\epsilon} \text{ and } b = \log \frac{1-\delta}{\delta}$$

are (distinct) positive real numbers. Specifically, each LLR element $l_i$ equals a, $-a$, b, or $-b$ depending on the channel output $y_i$ being 0, 1, 2, or 3, respectively.

Each error side information variable $m_i$ takes values in the set $\{a, b\}$, with probabilities $P(m_i=a)=a$ and $P(m_i=b)=(1-a)$. Lossless source coding methods can be applied to compress the error side information variables unless $a=\frac{1}{2}$. Ideally the size of the compressed error side information can be reduced to the entropy $H(m_i)$, which in this example equals $h(a)=-a \log_2 a-(1-a) \log_2(1-a)$. (The functions H and h are as defined above.)

In order to illustrate the effectiveness of data compression in the present context, two simple simulation studies will be reported. The simulations employ the arithmetic coding algorithm, which is a preferred method of lossless data compression for the error side information compressor 413.

In the first simulation study, the parameters were N=1000 and a=0.7. One hundred randomly generated samples of $m=(m_1, m_2, \ldots, m_{N=1000})$ were compressed by arithmetic coding. The average length of the compressed sequences was 891 bits, with the actual lengths varying between 860 and 934. The average savings in communications complexity was 11% relative to the uncompressed communication. The compression ratio 0.891 was within 1.1% of the entropy limit h(0.7)=0.881.

The second simulation study was identical to the first, except here a=0.9 was used. The average length of the compressed sequences was 476 bits, with the actual lengths varying between 388 and 568. The average savings in communications complexity was 52%. The compression ratio was within 1.5% of the entropy limit h(0.9)=0.479.

In general, the present principles have a communication complexity from the decode client 410 to the decode server 420 given by the sum of N(1−R) (for the error syndrome) and $NH(m_i)$ (an approximation to the length of the compressed error information). This may be compared with the communication complexity of an alternative scheme in which the decode client compresses the LLR values directly and sends them to the decode server (such a system would use an ordinary decoder instead of a syndrome decoder). The compression limit for such an alternative decoder is given by the $NH(l_i)$ which equals $NH(z_i, m_i)$ (the joint entropy of hard decisions and error side information) since $l_i$ and $(z_i, m_i)$ are in one-to-one correspondence. The joint entropy can be written as $H(z_i, m_i)=H(z_i)+H(m_i|z_i)$. In this example, $H(z_i)=1$ bit and $H(m_i|z_i)=H(m_i)$ since $m_i$ and $z_i$ are statistically independent. Thus, the communication complexity for the alternative scheme is $N+NH(m_i)$, which is greater than that of the present principles by an amount NR. This difference is significant for the case where R is close to 1 and $H(m_i)$ is not much larger than R. The present principles are expected to be most useful in applications where both these conditions are satisfied. One such application is optical communications, another is wireless communications in the THz range. In high-speed optical applications, the fiber-optic transmission medium is clean enough to support code rates R close to 1; and, fine-grained quantization is very costly to carry out at the very high data rates (100 Gb/s or more), leading to small $H(m_i)$ as in Examples 1-3. In the emerging THz communications, the transmission medium is not guaranteed to be clean enough to support code rates R close to 1 (except in close proximity use-cases) but the receiver technology is not mature enough to provide fine-grained LLR values, again leading to small values of $H(m_i)$.

Example 4

This example illustrates the present principles for a case where the channel output alphabet is continuous (an idealization of a very fine quantization), which necessitates the use of a quantizer as part of the HD/ESI generator 411. In the previous examples, the decode client received already quantized samples from the channel. The methods described in this example can be applied also to the case where the receiver 123 is inaccessible and there is need for a coarser quantization of the channel output in order to reduce the communication complexity from the decode client 410 to the decode server 420 to acceptable levels.

To be specific, it is assumed here that the channel 120 is an additive Gaussian noise channel (AGNC) with Binary Phase Shift Keying (BSPK) modulation. The transmitted codeword $x=(x_1, x_2, \ldots, x_N)$ is mapped into a BPSK signal $t=(t_1, t_2, \ldots, t_N)$ so that $t_i=A$ if $x_i=0$ and $t_i=-A$ if $x_i=1$ where $A>0$ is an amplitude parameter. The channel output is $y=(y_1, y_2, \ldots, y_N)$ is given by $y=t+n$ (addition of real vectors) where $n=(n_1, n_2, \ldots, n_N)$ is a noise vector with independent identically-distributed (i.i.d.) elements, with each $n_i$ having a Gaussian distribution with mean 0 and variance $\sigma^2$. Thus, the channel output alphabet is $\mathcal{Y}=(-\infty, \infty)$ and the channel transition probabilities are defined by a pair of probability density functions $$W(y_i | x_i = 0) = \frac{1}{\sqrt{2\pi}\sigma} e^{-\frac{(y_i-A)^2}{2\sigma^2}}$$

and $$W(y_i | x_i = 1) = \frac{1}{\sqrt{2\pi}\sigma} e^{-\frac{(y_i+A)^2}{2\sigma^2}}.$$

The ratio $A^2/\sigma^2$ will be referred to as the signal-to-noise ratio (SNR) in the following. The SNR is usually cited in decibels (dB). The dB value of a positive real number x is defined as $10 \log_{10} x$.

The HD/ESI generator 411 here follows the general approach in the first preferred embodiment. A formal calculation of the LLR values gives (using natural logarithms):

$$l_i = \log \frac{W(y_i|0)}{W(y_i|1)} = \frac{2Ay_i}{\sigma^2}.$$

The LLR value $l_i$ is a real number that can take any value in the range $(-\infty, \infty)$. Even if infinite precision calculation of the LLR value $l_i$ were possible, the present principles comprise quantization of the LLR values so as to reduce the communication complexity to acceptable levels.

Accordingly, the present principles apply an LLR calculation of the type $$l_i = Q\left(\log \frac{W(y_i|0)}{W(y_i|1)}\right)$$

where Q is a quantizer (a mapping from the real line $(-\infty, \infty)$ to a finite set of $\mathcal{L}$ of representation points. Specific options for a quantizer are discussed below.

Having computed the quantized LLR values $l_i \in \mathcal{L}$, the HD/ESI generator 411 calculates the hard decisions as $z_i=0$ if $l_i>0$ and $z_i=1$ if $l_i \leq 0$ and the error side information as $m_i=|l_i|$.

In the rest of this example, the amplitude parameter is fixed as $\lambda=1$.

A quantizer Q that can be used as part of the HD/ESI generator can be characterized quite generally by a pair of sets $Q=(\mathcal{B}, \mathcal{L})$ where $\mathcal{B}=\{b_1, b_2, \ldots, b_{M-1}\}$ is a set of boundary points and $\mathcal{L}=c_1, c_2, \ldots, c_M$ is a set of representation points. The number of representation points M can be an arbitrary integer. The quantizer mapping is such that, for any real number x, $Q(x)=c_1$ if $x<b_1$, $Q(x)=c_2$ if $b_1 \leq x < b_2$, $Q(x)=c_3$ if $b_2 \leq x < b_3$, etc., and $Q(x)=c_M$ if $x \geq b_{M-1}$.

The quantizer $Q=(\mathcal{B}, \mathcal{L})$ induces a quantizer on the error side information. The error side information variables $m_i$ take quantized values in the set $\mathcal{M}=\{|\ell|: \ell \in \mathcal{L}\}$.

Example 4 continues with a quantizer Q with $\mathcal{B}=\{-5.58, -2.23, 0, 2.23, 5.58\}$ and $\mathcal{L}=(-9.53, -3.79, -1.10, 1.10, 3.79, 9.53)$. (For example, this quantizer maps $-4.3$ to $-3.79$ and $6.4$ to $9.53$.) This specific quantizer follows a maximum mutual information design rule, described in the article "Winkelbauer, A. and Matz, G. (2015) 'On quantization of log-likelihood ratios for maximum mutual information', in 2015 IEEE 16th International Workshop on Signal Processing Advances in Wireless Communications (SPAWC), pp. 316-320".

The maximum mutual information design rule maximizes the mutual information $l(x_i; l_i)$ between the quantized LLR values $l_i$ and the channel inputs $x_i$ at a specific channel SNR $1/\sigma^2$ (recall that A=1). The quantizer $Q=(\mathcal{B}, \mathcal{L})$ given above is optimized for 9 dB SNR in the channel and remains fixed regardless of the actual operating SNR for the channel. At 9 dB SNR, each LLR value $l_i$ at the quantizer output takes the values $-9.53, -3.79, -1.10, 1.10, 3.79, 9.53$ with probabilities $0.4104, 0626, 0.0271, 0.0271, 0.0626, 0.4104$, respectively. At 9 dB SNR, the quantizer achieves a mutual information $l(x_i; l_i)=0.9892$ bits and the LLR entropy at the quantizer output is $H(l_i)=1.2372$ bits. The value $l(x_i; l_i)$ represents the Shannon capacity of the channel 120 after quantization. The entropy $H(l_i)$ is a lower limit to the communications complexity from the decode client 210 to the decoder server 220, and serves as a benchmark for the actual communications complexity discussed below.

For the above quantizer, the hard decisions derived from the quantized LLR values are equally likely to be 0 or 1 at every SNR. Thus, $H(z_i)=1$ bit at every SNR. This means that the hard decisions are incompressible. The error side information variables $m_i$ take values in the set $\mathcal{M}=\{1.10, 3.79, 9.53\}$ but their entropy $H(m_i)$ depends on the operating SNR. At 9 dB SNR, the entropy is $H(m_i)=0.2372$ bits. As expected, $H(l_i)=H(m_i)+H(z_i)$, which shows that the splitting of the LLR $l_i$ into a sign and a magnitude and processing them separately does not lead to a loss in the achievable rate of compression. The entropy $H(m_i)$ at a given SNR sets a limit on the compression possible for the error side information at that SNR. Since $H(m_i)$ changes with the SNR, the compression limit also changes. So, fixed source coding methods, such as Huffman coding, should be avoided. Motivated by this observation, the present principles employ adaptive source coding methods in their preferred embodiments.

Figure 5:
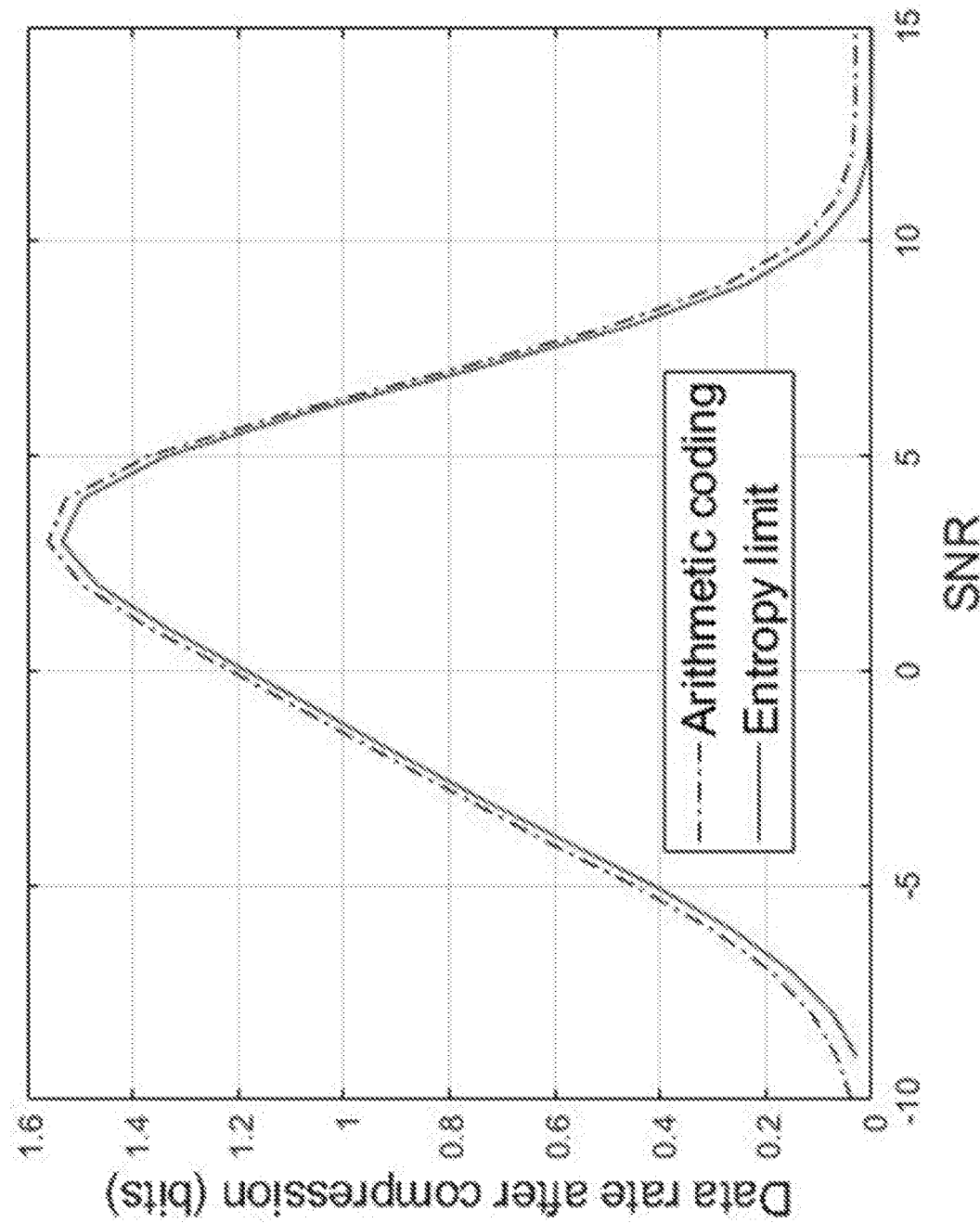
FIG. 5 is a graph illustrating the effectiveness of arithmetic coding in a preferred embodiment of the present principles.

The example continues with arithmetic coding as the method of adaptive source coding. The details of arithmetic coding and how it can be applied to the compression problem here are omitted since these are well known topics to a person skilled in the art. Only a simulation study will be reported here to provide empirical evidence for the effectiveness of arithmetic coding in the present context. In the simulation study, arithmetic coding was used to compress the error side information variables $m_i$ over an SNR range from $-10$ dB to $12$ dB in steps of 1 dB. The entropy limit $H(m_i)$ and the data rate achieved by arithmetic coding are shown in FIG. 5. As this example illustrates, arithmetic coding achieves a compression ratio which is near optimal over the entire range of SNR values.

In Example 4, the maximum mutual information quantizer has been used as an illustrative example. An alternative quantizer that may be simpler to implement is a uniform quantizer for which the spacing between boundary points are fixed. A person skilled in the art will recognize from the above example that the present principles can be practiced with other types of quantizers and source coding algorithms.

A Most Preferred Embodiment of the Present Principles

The most preferred embodiment of the present principles is a special case of the first and second preferred embodiments, with the further specification that the channel code used in the most preferred embodiment is a polar code, which is type of linear block code introduced in the reference "Arikan, E. (2009) 'Channel Polarization: A Method for Constructing Capacity-Achieving Codes for Symmetric Binary-Input Memoryless Channels', IEEE Transactions on Information Theory, 55(7), pp. 3051-3073".

Polar codes can be encoded in systematic or non-systematic manner; and there exist syndrome decoding algorithms for both cases. So, polar codes can be used as the channel code both in the first and the second preferred embodiments of the present principles. The use of polar codes (either in systematic or non-systematic form) together with a syndrome decoder constitutes the most preferred embodiment of the present principles. A brief discussion of polar coding follows in order to describe the syndrome decoding procedure for polar codes.

Polar codes are linear block codes that are defined for every block length $N=2^n$, for every integer $n \geq 1$, and every rate $R=K/N$, $1 \leq K \leq N$. A specific polar code of length $N=2^n$ and rate $R=K/N$ is defined by a $N \times N$ generator matrix $G=F^{\otimes n}$ over the binary field $\mathbb{F}_2=\{0,1\}$, where $$F = \begin{bmatrix} 1 & 0 \\ 1 & 1 \end{bmatrix}$$

and $F^{\otimes n}$ is the nth Kronecker power of F. Central to the polar code construction is a transform $x=uG$ where $u=(u_1, u_2, \ldots, u_N)$ is a source vector $x=(x_1, x_2, \ldots, x_N)$ is a codeword vector. In order to obtain a polar code of rate $R=K/N$, a frozen set $\mathcal{F} \sqsubset \{1,2,\ldots,N\}$ is chosen with size $|\mathcal{F}|=N-K$, and the source vector is frozen at the frozen set locations by setting $u\mathcal{F}=f$ where f is a fixed bit pattern (known at the decoder) that does not depend on the transmitted message. Ordinarily, one sets f=0 but here the description aims to be more general. The complementary set of coordinates, $\mathcal{J}=\mathcal{F}^c$, which are called the information set, are determined by the transmitted message $d=(d_1, d_2, \ldots, d_K)$.

In non-systematic polar coding, one sets $u\mathcal{F}=f$, $u\mathcal{J}=d$ and obtains the codeword x by computing the transform $x=uG$. This computational complexity of this computation is $O(N \log N)$.

The most preferred embodiment of the present principles employs systematic polar coding. In systematic coding of polar codes, one inserts the data into the codeword directly by setting $x\mathcal{J}=d$ and obtains the rest of the codeword $x\mathcal{F}$ from the system of equations $x=uG$ and $u\mathcal{F}=f$. The complexity of systematic encoding of polar codes is also $O(N \log N)$, as described in the references "E. Arikan, 'Systematic Polar Coding,' IEEE Communications Letters, vol. 15, no. 8, pp. 860-862, August 2011" and "E. Arikan, 'Method and system for error correction in transmitting data using low complexity systematic encoder,' U.S. Pat. No. 8,347,186 B1, 1 Jan. 2013".

The first preferred embodiments of the present principles require a syndrome decoder for non-systematic polar codes. There are many possible ways of constructing a syndrome decoder for polar codes. One possibility is to begin with a successive cancellation (SC) decoder for polar codes and turn it into a syndrome decoder by modifying its input variables. This approach is described next.

Figure 6:
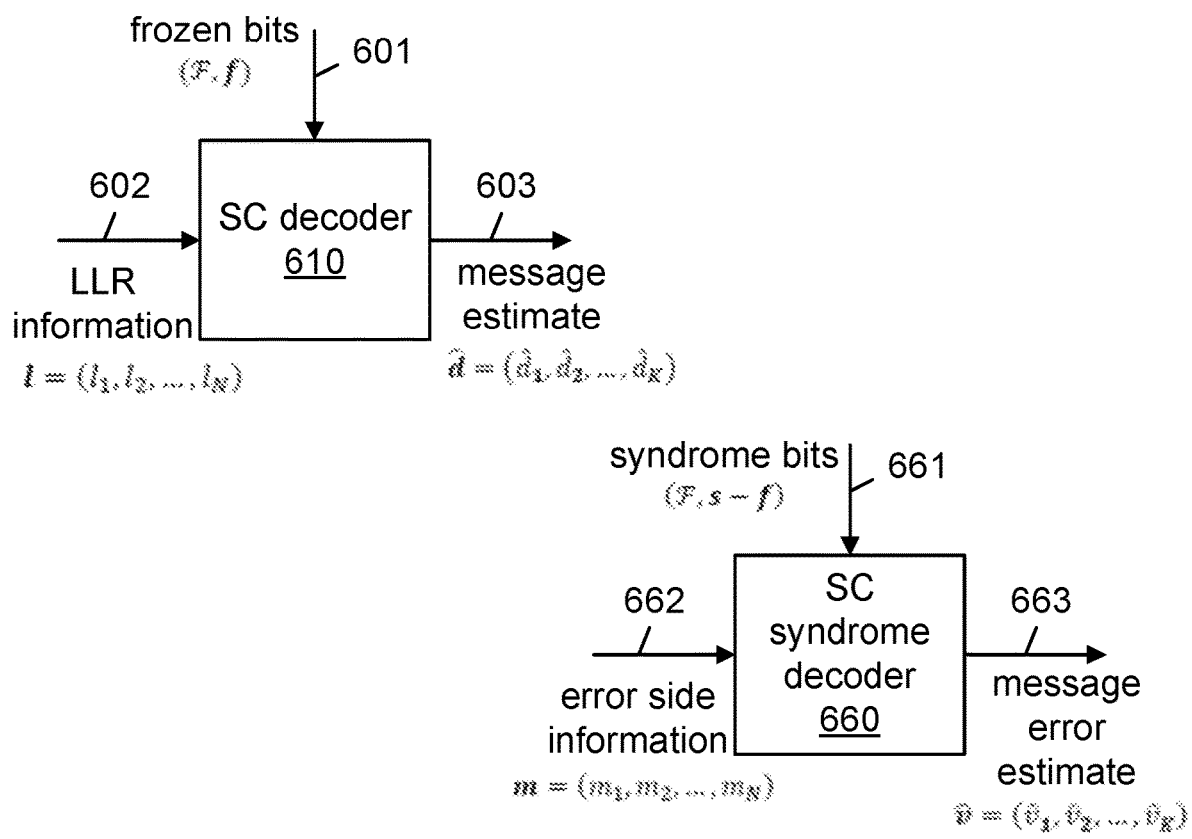
FIG. 6 illustrates an SC decoder and an SC syndrome decoder.

Turning to FIG. 6, an SC decoder 610 and an SC syndrome decoder 660 are illustrated. The SC decoder 610 comprises a first input 601, a second input 602, and an output 603. At the first input 601, the SC decoder 610 receives a frozen set $\mathcal{F}$ and a frozen bit pattern f, where $\mathcal{F}$ and f jointly indicate that $u\mathcal{F}=f$ for a source vector u. The inputs $\mathcal{F}$ and f are configuration parameters describing to the SC decoder the design of the polar code under consideration. At the second input 602, the SC decoder 610 receives an LLR information $l=(l_1, l_2, \ldots, l_N)$, which is a summary of the information coming from the channel about the transmitted codeword in the system. After carrying out the decoding operations, the SC decoder 610 produces at its output 603 a message estimate $\hat{d}=(\hat{d}_1, \hat{d}_2, \ldots, \hat{d}_K)$. Internal details of the SC decoder 610 are omitted since such detail is not relevant here; the method described here will work for turning any given SC decoder into a syndrome decoder. For the person skilled in the art, it will be sufficient to note that the SC decoder 610 herein works according to the basic principles of SC decoding as described in the reference "Arikan, E. (2009) 'Channel Polarization: A Method for Constructing Capacity-Achieving Codes for Symmetric Binary-Input Memoryless Channels', IEEE Transactions on Information Theory, 55(7), pp. 3051-3073".

The SC syndrome decoder 660 in FIG. 6 comprises a first input 661, a second input 602, and an output 663. The SC syndrome decoder 660 is an identical copy of the SC decoder 610 as far as their internal operations are concerned; the two decoders differ only in the way their respective inputs are prepared and their respective outputs are interpreted. Let $l=(l_1, l_2, \ldots, l_N)$ be an LLR vector, $z=(z_1, z_2, \ldots, z_N)$ a hard decisions vector, and $m=(m_1, m_2, \ldots, m_N)$ an error side information vector prepared in accordance with the first preferred embodiment of the present principles. Let $s=(s_1, s_2, \ldots, s_{N-K})$ be an error syndrome computed as $s=zH$ where H is a parity-check matrix for the polar code under consideration. For polar codes, a preferred method of computing the syndrome is to compute first the inverse transform $w=zG^{-1}$ and obtain the syndrome as $s=w\mathcal{F}$. The polar code generator matrix G has the property that $G^{-1}=G$. Thus, the computation $w=zG^{-1}$ is equivalent to a polar encoding operation and has computational complexity $O(N \log N)$, whereas the direct method of syndrome calculation by $s=zH$ requires $O(N^2)$ complexity if the special structure of the polar code generator is not exploited. Since by construction $xH=f$ for any codeword x in the polar code under consideration, the syndrome can be written as $s=zH=xH+eH=f+eH$. From this, the error syndrome is obtained as $eH=s-f$ where $s=zH$. The pair $(\mathcal{F}, s-f)$ is applied at the first input 661 of the SC syndrome decoder. The error side information m is applied at the second input 662 of the SC syndrome decoder. In response to these inputs, the SC syndrome decoder 660 generates a message error estimate $\hat{v}=(\hat{v}_1, \hat{v}_2, \ldots, \hat{v}_K)$ at an output 663. This completes the description of how to turn a given SC decoder into an SC syndrome decoder.

In summary, instead of using the SC decoder 610 with inputs $(\mathcal{F}, f)$ and l at the inputs 601 and 602, respectively, the SC syndrome decoder 660 is used with inputs $(\mathcal{F}, zH-f)$ and m at the inputs 661 and 662, respectively. Here, (z, m) are derived from l according to the present principles as described above. It will be clear to the person skilled in the art of polar coding that if the two decoders 610 and 660 are operated with their respective inputs as defined above, the message estimate $\hat{d}$ at the output 603 and the message error estimate $\hat{v}$ at the output 663 will be related to each other by $\hat{d}=w\mathcal{J}+\hat{v}$ where $w=zG^{-1}$ and $\mathcal{J}=\mathcal{F}^c$ is the complement of the frozen set. The outputs of the SC decoder and the SC syndrome decoder are coupled to each other in a one-to-one manner. Either decoder can be used as a substitute for the other with suitable pre- and post-processing of the respective input and output variables.

Figure 7:
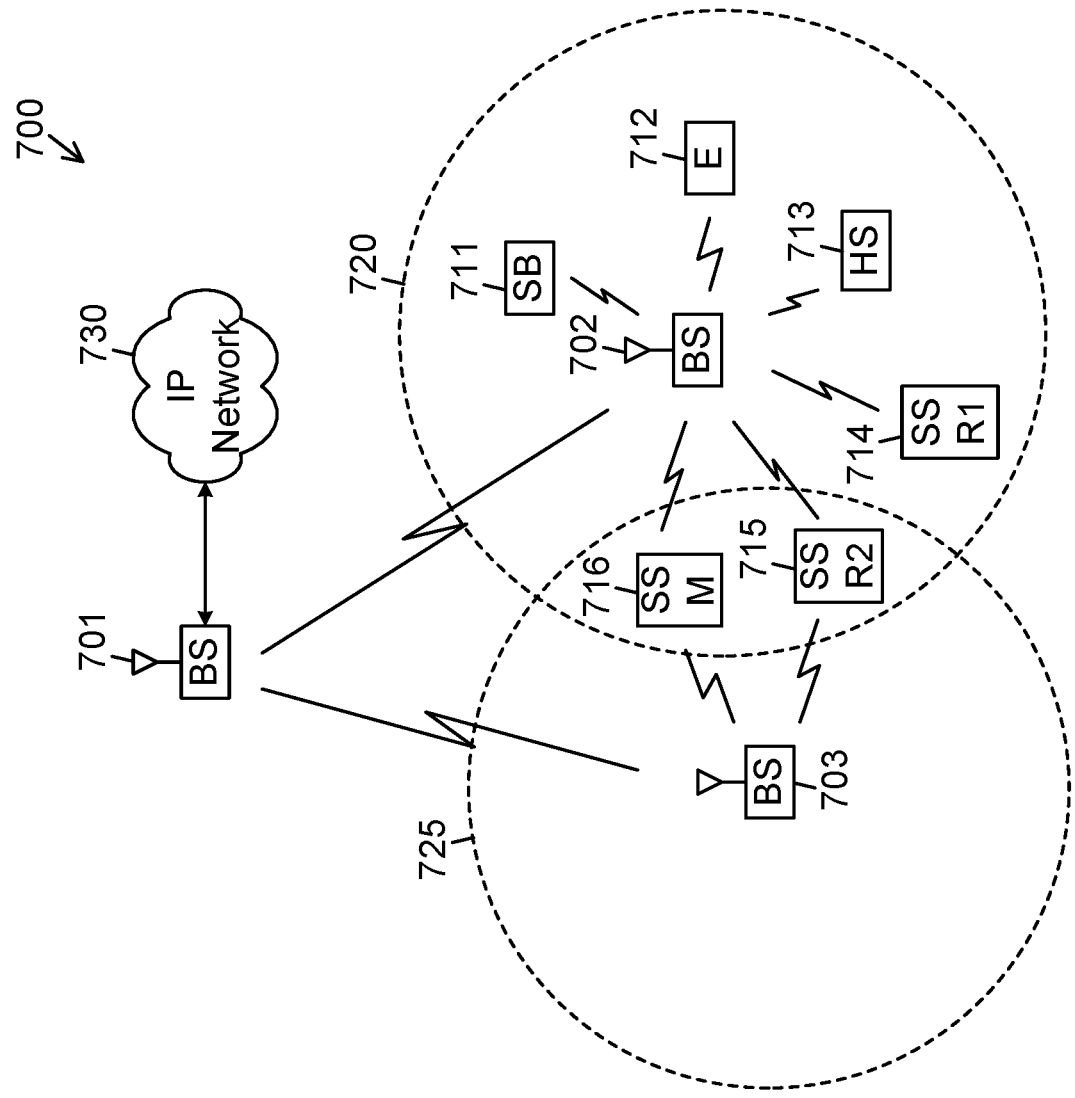
FIG. 7 illustrates an example wireless network within which channel decoding may be implemented according to this disclosure.

FIG. 7 illustrates an example wireless network within which channel decoding may be implemented according to this disclosure. The embodiment of the wireless network 700 shown in FIG. 7 is for illustration only. Other embodiments of the wireless network 700 could be used without departing from the scope of this disclosure. The wireless network 700 includes an eNodeB (eNB) 701, an eNB 702, and an eNB 703. The eNB 701 communicates with the eNB 702 and the eNB 703. The eNB 701 also communicates with at least one Internet Protocol (IP) network 730, such as the Internet, a proprietary IP network, or other data network.

Depending on the network type, other well-known terms may be used instead of "eNodeB" or "eNB," such as "base station" or "BS" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station" (or "MS"), "subscriber station" (or "SS"), "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 702 provides wireless broadband access to the network 730 for a first plurality of user equipments (UEs) within a coverage area 720 of the eNB 702. The first plurality of UEs includes a UE 711, which may be located in a small business (SB); a UE 712, which may be located in an enterprise (E); a UE 713, which may be located in a WiFi hotspot (HS); a UE 714, which may be located in a first residence (R1); a UE 715, which may be located in a second residence (R2); and a UE 716, which may be a mobile device (M) like a cell phone, a wireless laptop, a wireless personal digital assistant (PDA), tablet, or the like. The eNB 703 provides wireless broadband access to the network 730 for a second plurality of UEs within a coverage area 725 of the eNB 703. The second plurality of UEs includes the UE 715 and the UE 716. In some embodiments, one or more of the eNBs 701-703 may communicate with each other and with the UEs 711-716 using 3G, 4G or 5G, long-term evolution (LTE), LTE-A, WiMAX, or other advanced wireless communication techniques.

Dotted lines show the approximate extents of the coverage areas 720 and 725, which are shown as approximately circular for the purposes of illustration and explanation only. It should be clearly understood that the coverage areas associated with eNBs, such as the coverage areas 720 and 725, may have other shapes, including irregular shapes, depending upon the configuration of the eNBs and variations in the radio environment associated with natural and man-made obstructions.

As described in more detail below, one or more of BS 701, BS 702 and BS 703 include 2D antenna arrays as described in embodiments of the present disclosure. In some embodiments, one or more of BS 701, BS 702 and BS 703 support the codebook design and structure for systems having 2D antenna arrays.

Although FIG. 7 illustrates one example of a wireless network 700, various changes may be made to FIG. 7. For example, the wireless network 700 could include any number of eNBs and any number of UEs in any suitable arrangement. Also, the eNB 701 could communicate directly with any number of UEs and provide those UEs with wireless broadband access to the network 730. Similarly, each eNB 702-703 could communicate directly with the network 730 and provide UEs with direct wireless broadband access to the network 730. Further, the eNB 701, 702, and/or 703 could provide access to other or additional external networks, such as external telephone networks or other types of data networks.

The example channel decoding systems depicted in the figures and described above may be implemented in an eNB (such as eNB 702) and/or a UE (such as UE 716), as described in further detail below.

Figure 8A:
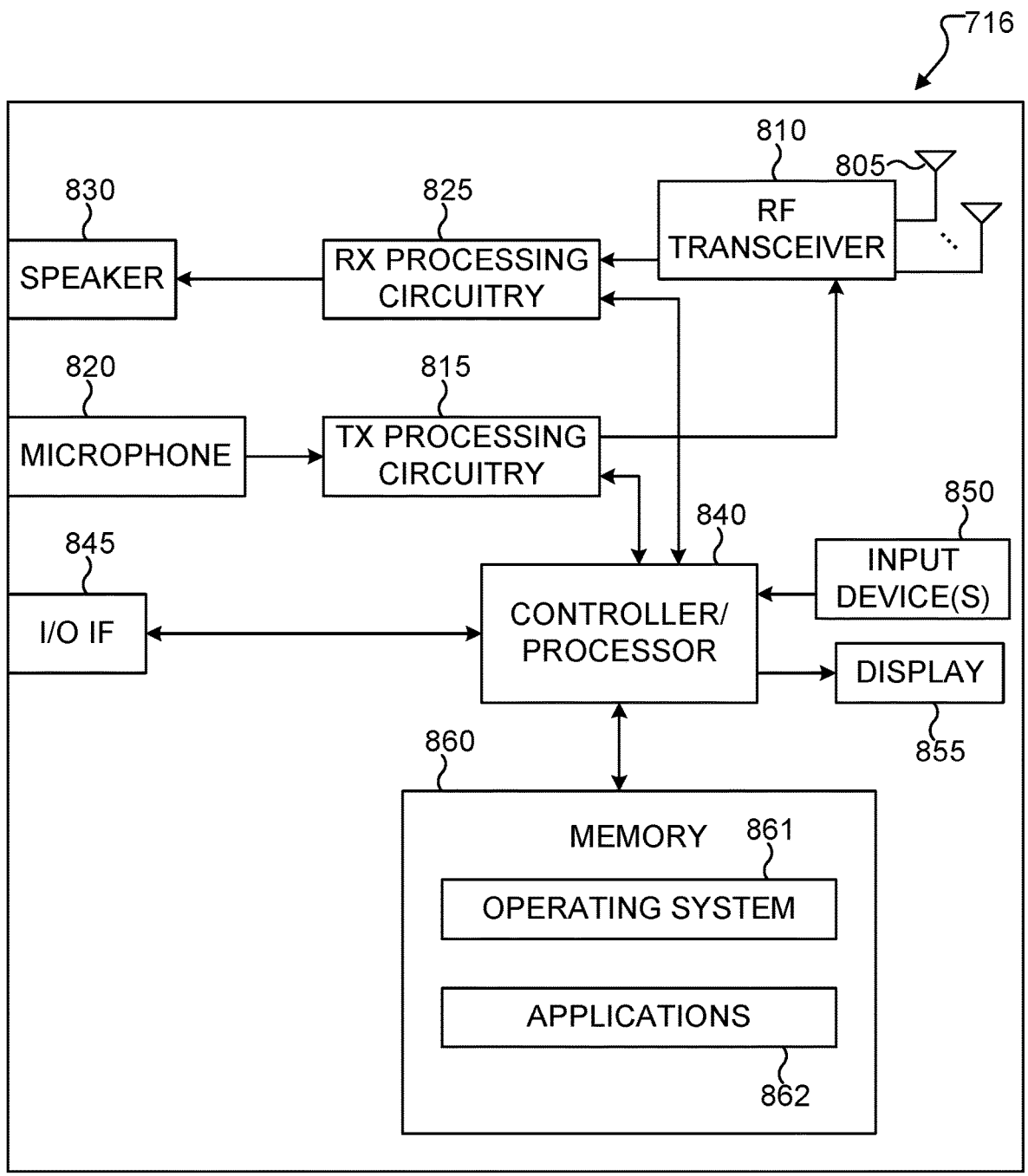
FIG. 8A illustrates an example user equipment network within which channel decoding may be implemented according to this disclosure.

FIG. 8A illustrates an example user equipment network within which channel decoding may be implemented according to this disclosure. The embodiment of the UE 716 illustrated in FIG. 8A is for illustration only, and the UEs 711-715 of FIG. 7 could have the same or similar configuration. However, UEs come in a wide variety of configurations, and FIG. 8A does not limit the scope of this disclosure to any particular implementation of a UE.

The UE 716 includes an antenna 805, a radio frequency (RF) transceiver 810, transmit (TX) processing circuitry 815 (which may be part of the transmission subsystem 140 in FIG. 1), a microphone 820, and receive (RX) processing circuitry 825 (which may be part of the reception subsystem 150 in FIG. 1). The UE 716 also includes a speaker 830, a main processor 840, an input/output (I/O) interface (IF) 845, a keypad 850, a display 855, and a memory 860. The memory 860 includes a basic operating system (OS) program 861 and one or more applications 862. Either the OS program 861, one of the applications 862, or some combination thereof may implement programming for channel decoding as described in the various embodiments of FIGS. 1 through 4 and 6.

The RF transceiver 810 receives, from the antenna 805, an incoming RF signal transmitted by an eNB of the network 700. The RF transceiver 810 may down-convert the incoming RF signal to generate an intermediate frequency (IF) or baseband signal which would be sent to the receiver (Rx) processing circuitry 825. The Rx processing circuitry 825 transmits the processed signal to the speaker 830 (such as for voice data) or to the main processor 840 for further processing (such as for web browsing data).

The transmit (Tx) processing circuitry 815 receives, as at least some input data for the transmitted message 101, analog or digital voice data from the microphone 820 or other outgoing baseband data (such as web data, e-mail, or interactive video game data) from the main processor 840. The Tx processing circuitry 815 implements channel encoding. The RF transceiver 810 receives the outgoing processed baseband or IF signal from the Tx processing circuitry 815 and up-converts the baseband or IF signal to an RF signal that is transmitted via the antenna 805.

The main processor 840 can include one or more processors or other processing devices and execute the basic OS program 861 stored in the memory 860 in order to control the overall operation of the UE 716. For example, the main processor 840 could control the reception of forward channel signals and the transmission of reverse channel signals by the RF transceiver 810, the Rx processing circuitry 825, and the Tx processing circuitry 815 in accordance with well-known principles. In some embodiments, the main processor 840 includes at least one programmable microprocessor or microcontroller, while in other embodiments the main processor includes dedicated circuitry (e.g., for systematic and/or non-systematic encoding or decoding processes, puncturing processes, data mapping, etc.) as well as (optionally) programmable logic or processing circuits.

The main processor 840 is also capable of executing other processes and programs resident in the memory 860, such as operations for channel quality measurement and reporting for systems having 2D antenna arrays as described in embodiments of the present disclosure. The main processor 840 can move data and/or instructions into or out of the memory 860 as required by an executing process. In some embodiments, the main processor 840 is configured to execute the applications 862 based on the OS program 861 or in response to signals received from eNBs or an operator. The main processor 840 is also coupled to the I/O interface 845, which provides the UE 716 with the ability to connect to other devices such as laptop computers and handheld computers. The I/O interface 845 is the communication path between these accessories and the main controller 840.

The main processor 840 is also coupled to the keypad 850 (which may simply be a single button or may be an array or other set of buttons) and the display unit 855. The operator of the UE 716 can use the keypad 850 to enter data into the UE 716. The display 855 may be a touch screen display or other display capable of rendering text and/or at least limited graphics, such as from web sites, and receiving touch inputs by a user in accordance with known practices. The memory 860 is coupled to the main processor 840, and at least a part of the memory 860 could include a random access memory (RAM), and another part of the memory 860 could include a Flash memory or other read-only memory (ROM).

Although FIG. 8A illustrates one example of UE 716, various changes may be made to FIG. 8A. For example, various components in FIG. 8A could be combined, further subdivided, or omitted and additional components could be added according to particular needs. As a particular example, the main processor 840 could be divided into multiple processors, such as one or more central processing units (CPUs) and one or more graphics processing units (GPUs). Also, while FIG. 8A illustrates the UE 716 configured as a mobile telephone or smartphone, UEs could be configured to operate as other types of mobile or stationary devices.

Figure 8B:
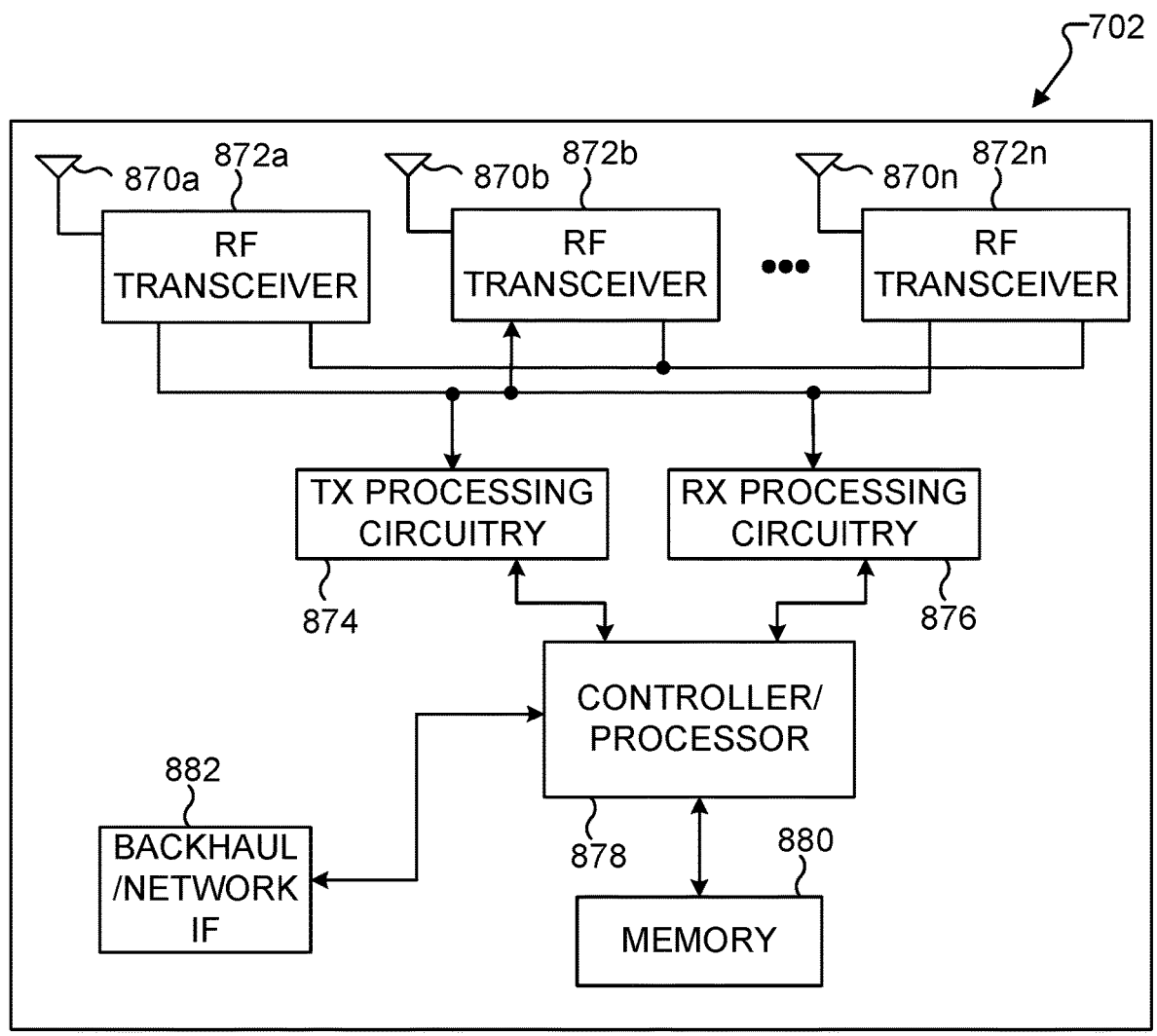
FIG. 8B illustrates an example enhanced NodeB (eNB) network within which channel decoding may be implemented according to this disclosure.

FIG. 8B illustrates an example enhanced NodeB (eNB) network within which channel decoding may be implemented according to this disclosure. The embodiment of the eNB 702 shown in FIG. 8B is for illustration only, and other eNBs of FIG. 7 could have the same or similar configuration. However, eNBs come in a wide variety of configurations, and FIG. 8B does not limit the scope of this disclosure to any particular implementation of an eNB. It is noted that eNB 701 and eNB 703 can include the same or similar structure as eNB 702.

As shown in FIG. 8B, the eNB 702 includes multiple antennas 870a-870n, multiple RF transceivers 872a-872n, transmit (Tx) processing circuitry 874, and receive (Rx) processing circuitry 876. In certain embodiments, one or more of the multiple antennas 870a-870n include 2D antenna arrays. The eNB 702 also includes a controller/processor 878, a memory 880, and a backhaul or network interface 882.

The RF transceivers 872a-872n receive, from the antennas 870a-870n, incoming RF signals, such as signals transmitted by UEs or other eNBs. The RF transceivers 872a-872n down-convert the incoming RF signals to generate IF or baseband signals. The IF or baseband signals are sent to the Rx processing circuitry 876, which generates processed signals by filtering, decoding, and/or digitizing the baseband or IF signals. The Rx processing circuitry 876 transmits the processed signals to the controller/processor 878 for further processing.

The Tx processing circuitry 874 receives at least some input data from transmitted message 101, analog or digital data (such as voice data, web data, e-mail, or interactive video game data) from the controller/processor 878. The Tx processing circuitry 874 implements source encoder and channel encoder to encode, multiplex, and/or digitize the outgoing baseband data to generate processed signals. The RF transceivers 872a-872n receive the outgoing processed signals from the Tx processing circuitry 874 and up-converts the baseband or IF signals to RF signals that are transmitted via the antennas 870a-870n.

The controller/processor 878 can include one or more processors or other processing devices that control the overall operation of the eNB 702. For example, the controller/processor 878 could control the reception of forward channel signals and the transmission of reverse channel signals by the RF transceivers 872a-872n, the Rx processing circuitry 876, and the Tx processing circuitry 874 in accordance with well-known principles. The controller/processor 878 could support additional functions as well, such as more advanced wireless communication functions. Any of a wide variety of other functions could be supported in the eNB 702 by the controller/processor 878. In some embodiments, the controller/processor 878 includes at least one microprocessor or microcontroller, while in other embodiments the main processor includes dedicated circuitry (e.g., for syndrome generation processes, etc.) as well as (optionally) programmable logic or processing circuits.

The controller/processor 878 is also capable of executing programs and other processes resident in the memory 880, such as a basic OS. The controller/processor 878 is also capable of supporting channel quality measurement and reporting for systems having 2D antenna arrays as described in embodiments of the present disclosure. In some embodiments, the controller/processor 878 supports communications between entities. The controller/processor 878 can move data and/or instructions into or out of the memory 880 as required by an executing process.

The controller/processor 878 is also coupled to the backhaul or network interface 882. The backhaul or network interface 882 allows the eNB 702 to communicate with other devices or systems over a backhaul connection or over a network. The interface 882 could support communications over any suitable wired or wireless connection(s). For example, when the eNB 702 is implemented as part of a cellular communication system (such as one supporting 3G, 4G, 5G, LTE, or LTE-A), the interface 882 could allow the eNB 702 to communicate with other eNBs over a wired or wireless backhaul connection. When the eNB 702 is implemented as an access point, the interface 882 could allow the eNB 702 to communicate over a wired or wireless local area network or over a wired or wireless connection to a larger network (such as the Internet). The interface 882 includes any suitable structure supporting communications over a wired or wireless connection, such as an Ethernet or RF transceiver.

The memory 880 is coupled to the controller/processor 878. Part of the memory 880 could include a RAM, and another part of the memory 880 could include a Flash memory or other ROM. In certain embodiments, a plurality of instructions is stored in memory. The plurality of instructions are configured to cause the controller/processor 878 to perform the systematic and/or non-systematic encoding or decoding processes, puncturing processes, data mapping, etc.

Although FIG. 8B illustrates one example of an eNB 702, various changes may be made to FIG. 8B. For example, the eNB 702 could include any number of each component shown. As a particular example, an access point could include a number of interfaces 882, and the controller/processor 878 could support routing functions to route data between different network addresses. As another particular example, while shown as including a single instance of Tx processing circuitry 874 and a single instance of Rx processing circuitry 876, the eNB 702 could include multiple instances of each (such as one per RF transceiver).

While the particular METHOD AND SYSTEM FOR DECODING DATA USING COMPRESSED CHANNEL OUTPUT INFORMATION is herein described in detail and is depicted in the drawings, it is to be understood that the subject matter which is encompassed by the present disclosure is limited only by the claims. Although the present disclosure has been described with exemplary embodiments, various changes and modifications may be suggested to one skilled in the art. It is intended that the present disclosure encompass such changes and modifications that fall within the scope of the appended claims. The description in the present application should not be read as implying that any particular element, step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. A decode client apparatus for use in a communication system for reliable transfer of a transmitted message from a source to a destination, wherein a channel encoder within the communication system encodes the transmitted message into a transmitted codeword from a channel code and transmits the transmitted codeword over a channel for the communication system and the channel produces a channel output in response to the transmitted codeword, the decode client apparatus comprising:
 a hard decisions and error side information (HD/ESI) generator configured to receive the channel output and generate hard decisions and error side information;
 an error syndrome generator configured to generate an error syndrome from the hard decisions and send the error syndrome to a decode server;
 an error side information compressor configured to generate a compressed error side information from the error side information and send the compressed error side information to the decode server;
 an error estimate decompressor configured to receive, from the decode server, a compressed error estimate, and generate an error estimate; and
 an error corrector configured to generate a message estimate from the hard decisions and the error estimate.

2. The decode client apparatus of claim 1, wherein the HD/ESI generator applies quantization to the channel output prior to generating the hard decisions and the error side information.

3. The decode client apparatus of claim 1, wherein the error side information is one of null error side information and non-null error side information, wherein the error side information compressor is not employed if the error side information is a null error side information and only the error syndrome is sent to the decode server by the decode client.

4. A decode client method for use in a communication system for reliable transfer of a transmitted message from a source to a destination, wherein a channel encoder encodes the transmitted message into a transmitted codeword from a channel code and transmits the transmitted codeword over a channel for the communication system and the channel produces a channel output in response to the transmitted codeword, the decode client method comprising:
 receiving the channel output at a hard decisions and error side information (HD/ESI) generator and generating hard decisions and error side information;
 generating, at an error syndrome generator, an error syndrome from the hard decisions and sending the error syndrome to a decode server;
 generating, at an error side information compressor, a compressed error side information from the error side information and sending the compressed error side information to the decode server;
 receiving, from the decode server, a compressed error estimate and generating an error estimate at the decode client; and
 generating, at an error corrector, a message estimate from the hard decisions and the error estimate.

5. The decode client method of claim 4, wherein the HD/ESI generator applies quantization to the channel output prior to generating the hard decisions and the error side information.

6. The decode client method of claim 4, wherein the error side information is one of null error side information and non-null error side information, wherein the error side information compressor is not employed if the error side information is a null error side information and only the error syndrome is sent to the decode server by the decode client.

7. A multi-client split decoder system for carrying out channel decoding, the multi-client split decoder system comprising: a plurality of decode clients in a client-server architecture subject to privacy constraints, wherein an ith decode client among the plurality of decode clients is configured to receive an ith channel output from an ith channel, wherein an ith transmitted codeword is obtained from an ith transmitted message, wherein the ith channel output is a corrupted version of the ith transmitted codeword from an ith channel code, wherein the ith decode client is further configured to generate an ith compressed error information from the ith channel output, wherein the ith compressed error information is independent of and contains no information about the ith transmitted message, and send the ith compressed error information over a communication network to a decode server, wherein the ith decode client is further configured to receive, from the communication network, an ith compressed error estimate generated by the decode server, and generate an estimate of the ith transmitted message without the decode server learning any information about the ith transmitted message.

8. A decode server apparatus for use in a communication system for reliable transfer of a transmitted message from a source to a destination, wherein a channel encoder within the communication system encodes the transmitted message into a transmitted codeword from a channel code and transmits the transmitted codeword over a channel for the communication system, the channel produces a channel output in response to the transmitted codeword, a decode client receives the channel output, generates an error syndrome and a compressed error side information, and sends to the decode server the error syndrome and the compressed error side information, the decode server apparatus comprising:
 an error side information decompressor configured to receive the compressed error side information and decompress the compressed error side information to recover an error side information;

an error estimator configured to receive the error syndrome and the error side information recovered by the error side information decompressor and generate an error estimate; and an error estimate compressor configured to generate a compressed error estimate from the error estimate and transmit the compressed error estimate to the decode client.

9. The decode server apparatus of claim 8, wherein the error side information is one of null error side information and non-null error side information, wherein the error side information decompressor is not employed if the error side information is a null error side information and only the error syndrome is received from the decode client.

10. A decode server method for use in a communication system for reliable transfer of a transmitted message from a source to a destination, wherein a channel encoder encodes the transmitted message into a transmitted codeword from a channel code and transmits the transmitted codeword over a channel for the communication system, the channel produces a channel output in response to the transmitted codeword, a decode client receives the channel output, generates an error syndrome and a compressed error side information, and sends to the decode server the error syndrome and the compressed error side information, the decode server method comprising:

receiving, at an error side information decompressor, the compressed error side information and decompressing the compressed error side information to recover an error side information;

receiving, at an error estimator, the error syndrome and the error side information recovered by the error side information decompressor and generate an error estimate; and generating, at an error estimate compressor, a compressed error estimate from the error estimate and transmitting the compressed error estimate to the decode client.

11. The decode server method of claim 10, wherein the error side information is one of null error side information and non-null error side information, wherein the error side information decompressor is not employed if the error side information is a null error side information and only the error syndrome is received from the decode client.

12. A multi-client split decoder system for carrying out channel decoding, the multi-client split decoder system comprising:

a decode server communicably coupled to a plurality of decode clients in a client-server architecture subject to privacy constraints, wherein the decode server is configured to receive, from an ith decode client among the plurality of decode clients over a communication network, an ith compressed error information generated from an ith channel output for an ith channel, wherein the ith channel output is a corrupted version of an ith transmitted codeword from an ith channel code, wherein the ith transmitted codeword is obtained from an ith transmitted message, wherein the ith compressed error information comprises an ith compressed error side information and an ith error syndrome, and wherein the ith compressed error information is independent of and contains no information about the ith transmitted message, decompress the ith compressed error side information to recover an ith error side information, generate an ith error estimate from the ith error side information and the ith error syndrome, compress the ith error estimate to obtain an ith compressed error estimate, and send the ith compressed error estimate to the ith decode client, wherein the ith compressed error estimate is used by the ith decode client to generate an estimate of the ith transmitted message without the decode server learning any information about the ith transmitted message.

\* \* \* \* \*